(12) United States Patent
Shimonaka et al.

(10) Patent No.: US 6,480,640 B1
(45) Date of Patent: Nov. 12, 2002

(54) INTEGRATED OPTICAL CIRCUIT DEVICE AND METHOD FOR PRODUCING THE SAME

(75) Inventors: Atsushi Shimonaka, Yamatokoriyama; Hidenori Kawanishi, Nara, both of (JP)

(73) Assignee: Sharp Kabushiki Haisha (JP)

( * ) Notice: Subject to any disclaimer, the term of this patent is extended or adjusted under 35 U.S.C. 154(b) by 0 days.

(21) Appl. No.: 09/200,645

(22) Filed: Nov. 25, 1998

(30) Foreign Application Priority Data

Nov. 28, 1997 (JP) .............................. 9-327912

(51) Int. Cl.$^7$ .............................. G02B 6/12; H01S 3/08
(52) U.S. Cl. .......................... 385/14; 385/131; 372/44; 359/346
(58) Field of Search ...................... 385/14, 131, 40–48, 385/129, 147; 372/44

(56) References Cited

U.S. PATENT DOCUMENTS 5,640,474 A * 6/1997 Tayag ........................... 385/43
5,692,001 A * 11/1997 Tiemeijer ..................... 372/44

FOREIGN PATENT DOCUMENTS

JP 63-182882 A 7/1988

OTHER PUBLICATIONS

Koch, T.L. et al., "Tapered Waveguide InGaAs/InGaAsP Multiple–Quantum–Well Lasers" *IEEE Photonics Tech. Lett.* 2(2):88–90.
Pennings, E.C.M. et al., "Ultracompact, low–loss directional couplers on InP based on self–imaging by multimode interference" *Appl. Phys. Lett.* 59(16):1926–1928 (1991).

* cited by examiner

*Primary Examiner*—Frank G. Font
*Assistant Examiner*—Michael P Mooney
(74) *Attorney, Agent, or Firm*—Morrison & Foerster LLP

(57) ABSTRACT

An integrated optical circuit device includes: a first optical element section including first and second element regions deposited along a thickness direction; a second optical element section formed away from the first optical element section, and a multimode interference region provided between the first and second optical element sections, the multimode interference region including a buried portion formed along a light propagation direction. The first and second optical element sections are optically coupled to each other via the multimode interference region.

4 Claims, 18 Drawing Sheets

Optical output : small

Optical output : large

INTEGRATED OPTICAL CIRCUIT DEVICE AND METHOD FOR PRODUCING THE SAME

BACKGROUND OF THE INVENTION

1. Field of the Invention

The present invention relates to an integrated optical circuit device and a method for producing the same, and more specifically, to a method for coupling a plurality of optical elements. In particular, the present invention relates to an integrated optical circuit device incorporating a semiconductor laser section and an optical waveguide section having different near fields from each other, as well as a method for producing the same.

2. Description of the Related Art

Conventionally, integrated optical circuit device incorporating a semiconductor laser element (also referred to as the "semiconductor laser section") and an optical waveguide element (also referred to as the "optical waveguide section") having different near fields from each other are produced by a hybrid method which involves separately fabricating a semiconductor laser element and an optical waveguide element having different near fields and then combining the two elements. However, the hybrid method requires very accurate positioning and therefore is not highly industrially applicable, i.e., is not highly adaptable to being efficiently produced.

In order to solve this problem, there has been proposed a method which integrally forms a semiconductor laser element and an optical waveguide element on the same substrate.

For example, Japanese Laid-open Publication No. 63-182882 discloses a structure Including an active layer 2 and a cladding layer 3 deposited on an InP substrate 1 as shown in FIG. 14. A portion of the deposited active layer 2 and the cladding layer 3 is etched away, so that a buffer layer 5, an optical waveguide layer 6, and a protective layer 7 are integrally formed in the etched portion. An electrode 8 is formed over the remaining portion of the active layer 2 and the cladding layer 3 so as to function as a semiconductor laser section.

FIG. 15 shows another conventional example of an integrated semiconductor laser and optical waveguide disclosed in IEEE PHOTONICS TECHNOLOGY LETTERS, vol. 2, No. 2, p.88 (1990 February), which includes a semiconductor laser section 13 and an optical waveguide section 11 which are integrally formed with a tapered section 12 interposed between, such that the tapered section 12 provides a gradually varying light distribution.

However, the structure shown in FIG. 14 inevitably results in the formation of a section 9 between the active layer 2 and the optical waveguide layer 6 which lacks the function of light confinement in a vertical direction. Since light cannot be confined along the vertical direction in the section 9, unwanted light radiation occurs not directing towards the optical waveguide layer 6, thereby decreasing the coupling efficiency to the optical waveguide layer 6.

Furthermore, since the active layer 2 and the optical waveguide layer 6 are formed through separate growth processes, it is difficult to align the active layer 2 and the optical waveguide layer 6 along the height direction within the controllability of available crystal growth technology. For example, in the case where the optical waveguide layer 6 is formed by a common metal organic chemical vapor deposition method (hereinafter ter referred to as the "MOCVD method"), its thickness and position along the height direction may be offset from design values by about 5% to 10%. In general, it is desirable to form an optical waveguide layer so as to have a thickness of several $\mu$m to facilitate coupling with external elements (e.g., with an optical fiber), and this results in a buffer layer (underlying the optical waveguide layer) having a thickness of several $\mu$m. In such cases, the total positional offset along the height direction may be as great as 0.1 to 0.5 $\mu$m, and the thickness of the section 9 emerging between the active layer 2 and the optical waveguide layer 6 may also be on the order of $\mu$m, resulting in a coupling loss of about 1 dB (aside from coupling losses due to mode mismatching). The above-described positional offset, or light radiation in a section lacking the light confinement function, becomes especially remarkable in elements having a small light distribution width, e.g., semiconductor lasers.

On the other hand, in the structure shown in FIG. 15, since the semiconductor laser section 13 and the optical waveguide section 11 are coupled via the tapered section 12 providing a gradually varying light distribution, substantially no light radiation occurs between the two sections 13 and 11 so that highly efficient optical coupling may be obtained. However, the formation of the tapered section 12 requires several (e.g., three or more, for the illustrated structure) etching processes and regrowth processes. Such complexity in the production process, as well as degradation in the crystallinity of the tapered section 12 and the optical waveguide section 11 during the regrowth process, detracts from the theoretical effects of this technique so much that no industrial applications of this technique have been reported heretofore.

In addition, the structure in FIG. 15 is also susceptible to some propagation loss due to loss of free carriers within the optical waveguide section 11 because the optical waveguide layer of the optical waveguide section 11 and the active layer of the semiconductor laser section 13 are formed of the same material, indicative of insufficient characteristics as an optical waveguide section 11.

SUMMARY OF THE INVENTION

An integrated optical circuit device of the invention includes: a first optical element section including first and second element regions deposited along a thickness direction; a second optical element section formed away from the first optical element section; and a multimode interference region provided between the first and second optical element sections, the multimode interference region including a buried portion formed along a light propagation direction. The first and second optical element sections are optically coupled to each other via the multimode interference region.

The buried portion of the multimode interference region may be arranged so as to have a length such that light outgoing from the first optical element section reaches via translation the second optical element section while retaining a light distribution shape at the time of outgoing from the first optical element section.

A width of the buried portion of the multimode interference region along a direction perpendicular to the light propagation direction may change in one of a gradual manner and a stepwise manner.

A thin interface region may be formed between the first optical element section and the multimode interference region.

According to another aspect of the present invention, an integrated optical circuit device includes: a first optical element section including first and second element regions deposited along a thickness direction and having mutually different light distribution widths; a multimode interference region formed in a position along a propagation direction of light outgoing from the first optical element section, the multimode interference region including a buried portion which has a multimode waveguide structure along each of the thickness direction and an in-plane direction which is perpendicular to the thickness direction; and a second optical element section formed away from the first optical element section with the multimode interference region interposed therebetween. The first and second optical element sections are optically coupled to each other via propagation of the light outgoing from the first optical element section through the multimode interference region to the second optical element section.

In the above-mentioned structure of the integrated optical circuit device, the second optical element section may include a mesa structure which is linearly aligned with the first optical element section and the buried portion of the multimode interference region.

Furthermore, the buried portion of the multimode interference region may include two or more layered subregions.

A method for producing an integrated optical circuit device of the invention includes: a formation step for forming a first optical element section including first and second element regions deposited along a thickness direction concurrently with a second optical element section disposed away from the first optical element section; a first etching step for etching a region between the first optical element section and the second optical element section to form an etched groove; and a burying step for forming a buried portion of a multimode interference region in the etched groove.

In one embodiment, in the first etching step, substantially all of a portion in which the multimode interference region is to be formed is etched away to form the etched groove, and the burying step includes: a step of burying the entire etched groove with material constituting the buried portion of the multimode interference region to form a first buried layer; a second etching step for etching away a predetermined portion of the first buried layer to leave a portion corresponding to the buried portion of the multimode interference region; and a step for forming a thin film or a second buried layer so as to cover sides of the remained buried portion of the multimode interference region.

In one embodiment, the first etching step concurrently forms a mesa structure for light confinement along a transverse direction in the second optical element section, According to another aspect of the invention, a method for producing an integrated optical circuit device includes: a step of forming a multimode interference region having a buried portion; a step of etching a predetermined region in the vicinity of the multimode interference region so as to form at least two etched-away portions in positions interposing the buried portion of the multimode interference region; and a step of forming a first optical element section including first and second element regions deposited along a thickness direction concurrently with a second optical element section so that the first optical element section is formed in one of the at least two etched-away portions and the second optical element section is formed in the other etched-away portion.

In one embodiment, etching for forming the multimode interference region is performed concurrently with etching for forming a mesa structure for light confinement along a transverse direction in the second optical element section.

In the above-mentioned method of the invention, an etched hole in which an upper electrode of the first optical element section is provided and a ridge of the second optical element section are concurrently formed in the same etching process.

In accordance with the integrated optical circuit device according to the present invention, an optical waveguide layer and an active layer of a semiconductor laser section are sequentially formed on a semiconductor substrate; a portion of the resultant composite is etched away into and below the active layer and the optical waveguide; and a buried portion of a multimode interference region is buried in the etched portion as a layer having such a refractive index as to function as a multimode waveguide in the vertical direction. This buried layer may be interpreted as the multimode interference region in the narrow sense.

The multimode interference region (more strictly, the buried portion thereof) allows the light exiting from the semiconductor laser section to be led into the distant optical waveguide section. Thus, an integrated optical circuit device having a high coupling efficiency can be provided. Since the optical waveguide layers of the optical waveguide section and the semiconductor laser section are isolated along the vertical direction, the optical waveguide section can be produced without being doped. As a result, the light absorption of the optical waveguide section can be minimized.

By optimizing the length of the multimode interference region, it becomes possible to further improve the coupling efficiency between optical elements having different light distribution widths along the direction in which the multiple layers are deposited (hereinafter referred to as the "thickness direction").

Furthermore, when employing a semiconductor laser element (section) and an optical waveguide element (section) as the optical elements, the enhanced effects of the present invention can be obtained since there exists a great difference in light distribution widths between these elements.

Furthermore, by employing an optical buffer layer and v plurality of multimode interference regions, it becomes possible to further enhance the coupling efficiency.

Furthermore, by varying the width of the buried portion of the multimode interference region in a gradual or stepwise manner, it becomes possible to further enhance the optical coupling between optical elements having different light distribution widths along the transverse direction. The effects provided by such an embodiment of the present invention can be further enhanced by ensuring that the rate of change of the width becomes smaller in a region having a smaller width.

Furthermore, by incorporating a multimode interference region functioning as the multimode waveguide along both the thickness direction and the transverse direction, it becomes possible to minimize the influence of manufacturing accuracy of the multimode interference region on the optical coupling efficiency. By adopting a plurality of multimode interference regions along both the thickness direction and the transverse direction using an optical buffer layer, it becomes possible to achieve a high coupling efficiency without being affected by the manufacturing accuracy.

In the case of using a semiconductor laser element (section) as an optical element, an integrated optical circuit device which is capable of operating at a low threshold level can be obtained by providing an insulation layer between the semiconductor laser element (section) and the multimode interference region so as to prevent a current from being injected into the multimode interference region.

Furthermore, all the optical elements according to the present invention can be produced through the same process. Therefore, the relative positioning of the optical elements is facilitated without misalignment along the height direction. Hence, the coupling efficiency is not degraded even in the case of poor processing accuracy.

In the fabrication of the integrated optical circuit device according to the present invention, the formation of a lower electrode of the semiconductor laser section and the formation of a ridge of the optical waveguide section can be performed in the same process, thereby facilitating the fabrication. Alternatively, the fabrication can also be facilitated by performing the burying process of a mesa to be provided for light confinement in the optical element section along the transverse direction and the burying process of the multimode interference region in the same process.

By forming the multimode interference region through the burying process of an etched groove, not through the burying process of an etched hole, a more planar multimode interference region can be obtained resulting in enhanced characteristics.

Preferably, one or more layers for forming the multimode interference region are deposited on a flat substrate, and a portion thereof is etched away while the rest thereof remains to function as the multimode interference region and a plurality of optical elements are then formed. This enables the fabrication of the multimode interference region having substantially flat top and bottom surfaces.

By ensuring that the aluminum mole fraction in a material (e.g., GaAlAs) which is used for a multimode interference region is 0.3 or less, it becomes possible to achieve excellent selective burying result without unwanted deposition of aluminum on a mask or the like. Thus, the resultant multimode interference region performs excellent intended functions.

Thus, the invention described herein makes possible the advantages of (1) providing an integrated optical circuit device in which a plurality of optical elements such as a semiconductor laser and an optical waveguide are produced by the same crystal growth process, with no layer existing between the optical elements that hinders optical coupling therebetween, and (2) providing a method producing such an integrated optical circuit device.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
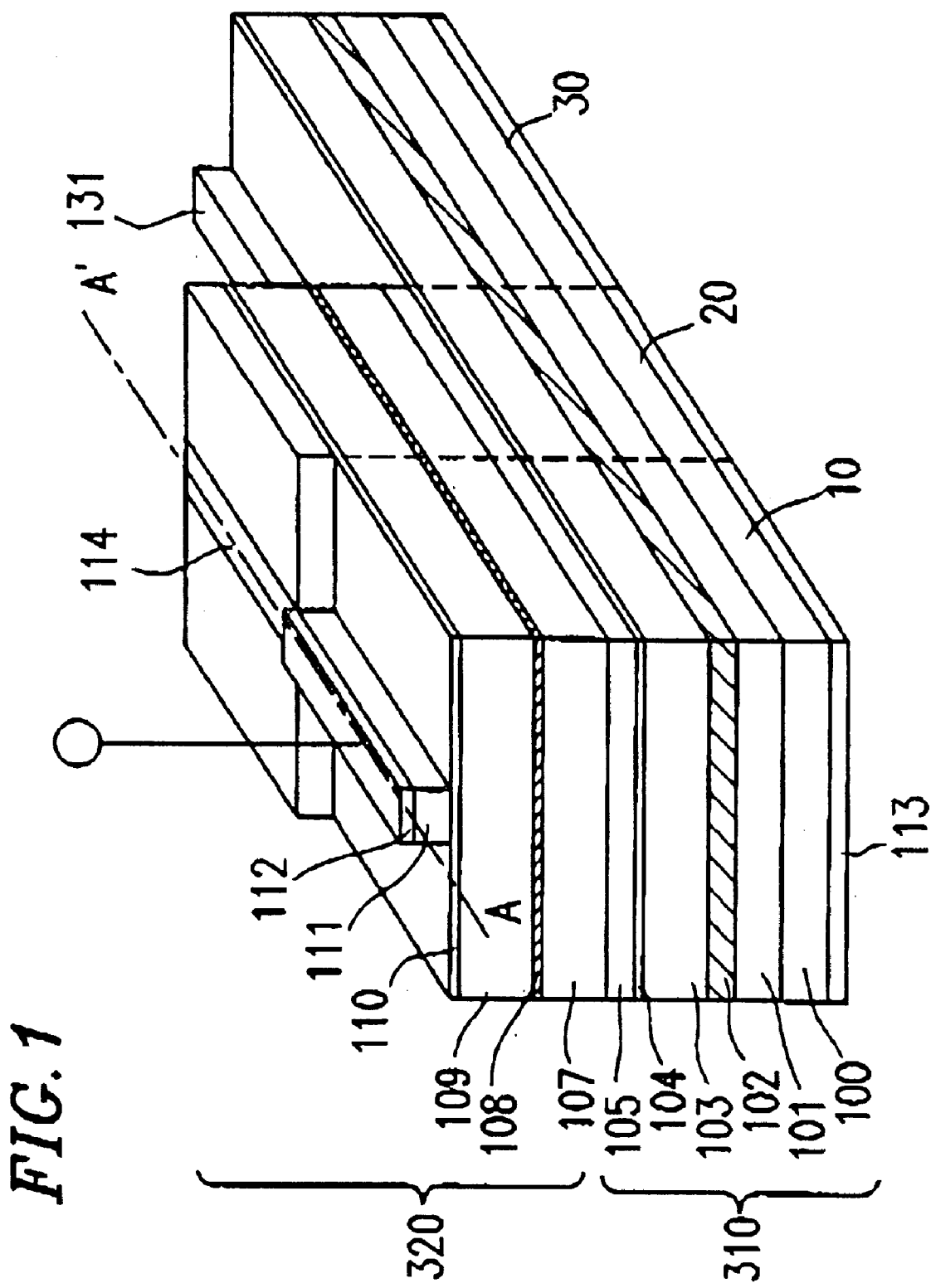
FIG. 1 is a perspective view illustrating a mode conversion type semiconductor laser device as an integrated optical circuit device according to Example 1 of the present invention.

Hereinafter, Example 1 of the present invention will be described with reference to FIG. 1. Example 1 illustrates a mode conversion type laser element in which the emission mode of an AlGaAs type semiconductor laser is converted.

A method of producing the semiconductor laser will be described before illustrating the functions thereof.

In order to form an optical waveguide, an n-type $Al_{0.22}Ga_{0.78}As$ first optical guide layer 101, an n-type $Al_{0.20}Ga_{0.80}As$ optical waveguide layer 102 (thickness: 2 μm), an n-type $Al_{0.22}Ga_{0.78}As$ second optical guide layer 103, an n-type $Al_{0.8}Ga_{0.2}As$ etching stopper layer 104, and an n-type $Al_{0.22}Ga_{0.78}As$ third optical guide layer 105 are layered on an n-type GaAs substrate 100 in this order, by using a usual MOCVD method. Thus, the optical waveguides are provided for both a semiconductor laser section 10 and an optical waveguide section 30.

On the above multilayer structure, an n-type $Al_{0.7}Ga_{0.3}As$ first cladding layer 107, an i-type GaAs active layer 108 (thickness: 0.1 μm), a p-type $Al_{0.7}Ga_{0.3}As$ second cladding layer 109, a p-type Gays etching stopper layer 110, and a p-type third cladding layer 111 are formed in this order, thereby forming a light emitting portion of a semiconductor laser element. As a result, the semiconductor laser section 10 includes a first element region 310 mainly exhibiting a light waveguiding function and a second element region 320 mainly exhibiting a light emitting function, which are stacked in the thickness direction.

The thicknesses of the respective layers can be selected in accordance with the particular design of the integrated optical circuit device; however, in the present example, the center of the optical waveguide layer 102 is at a distance of 1.45 μm from the top surface of the GaAs substrate 100, and the active layer 108 of the semiconductor laser section 10 is at a distance of 3.55 μm from the top surface of the GaAs substrate 100.

Next, the method for producing a multimode interference region 20, in particular a buried portion 114 thereof, will be described. The buried portion 114 of the multimode interference region 20 can be interpreted as the multimode interference region in a narrow sense, and is a multimode waveguide 114 (width: 2 μm, and length: 670 μm) formed between the semiconductor laser section 10 and the optical waveguide section 30.

First, a patterned $SiO_2$ film (not shown) is deposited over the layered structure including the layers 101 through 111 deposited by the above-mentioned processes except for the region where the buried portion 114 is to be formed. The portions where no $SiO_2$ film is formed are vertically etched to a depth of 5 μm by using a reactive ion beam etching (hereinafter referred to as "RIBE"). The etching time is controlled so as to continue the etching until reaching the n-type GaAs substrate 100. More preferably, the film thicknesses are monitored during the etching.

Figure 2:
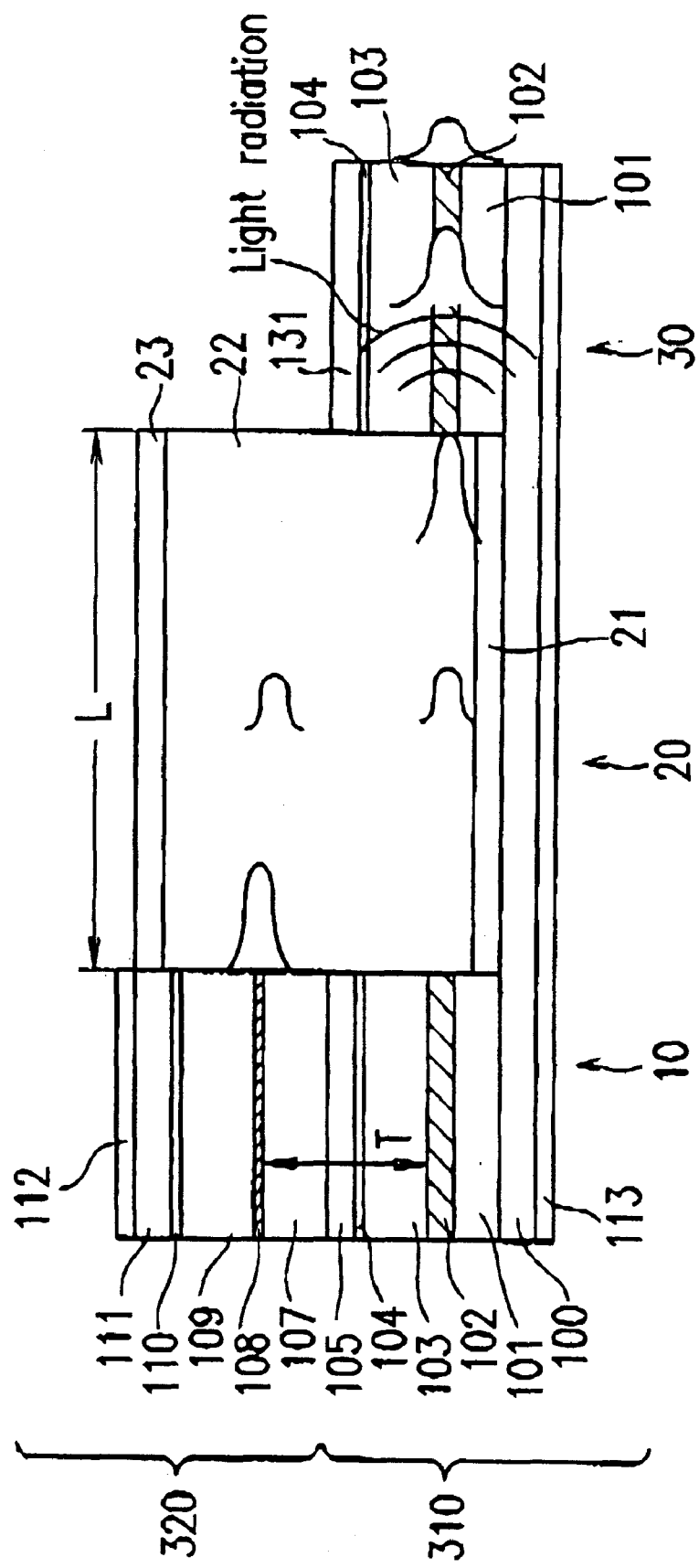
FIG. 2 is a diagram illustrating the operation of the device according to Example 1 of the present invention shown in FIG. 1.

Thereafter, a second MOCVD growth process is performed so as to form the buried portion 114 of the multimode interference region 20 with AlGaAs. Specifically, as shown in FIG. 2, the uppermost 0.25 μm portion and the lowermost 0.25 μm portion along the thickness direction are buried with $Al_{0.20}Ga_{0.80}As$ layers 21 and 23, while the remaining 4.5 μm portion is buried with an $Al_{0.195}Ga_{0.805}As$ layer 22. As a result, the buried portion 114 of the multimode interference region 20 functions as a single mode waveguide having a width of 2 μm along the transverse direction, and as a multimode waveguide having a thickness of 4.5 μm along the vertical direction. By ensuring that the aluminum mole fraction in the material to be used for forming the buried portion 114 is 0.3 or less, substantially no crystals are deposited on the $SiO_2$ mask.

The resultant buried portion 114 of the multimode interference region 20 is disposed so that its center line along the height direction is aligned with a substantial center line between the active layer 108 and the optical waveguide layer 102.

Next, succeeding processes for producing the semiconductor laser section 10 and the optical waveguide section 30 will be described.

The formed $SiO_2$ mask is removed by using a buffered hydrofluoric acid. Another patterned mask of an $SiO_2$ film (not shown) is deposited in order to further selectively etch the optical waveguide section 30. By using this mask with a sulfuric acid-type etchent, the optical waveguide section 30 is evenly etched part of the way into the first cladding layer 107. Thereafter, another etching is performed until reaching immediately above the third optical guide layer 105 by using a hydrofluoric acid-type etchant. Furthermore, a ridge 131 having a width of 2 μm along the extension of the semiconductor laser section 10 and the multimode interference region 20 is formed by etching the optical waveguide section 30 using an appropriate mask pattern with an ammonium-type etchant to immediately above the etching stopper layer 104, where the etching is automatically stopped. Then, in order to form a ridge 111 (width: 2 μm) in the semiconductor laser section 10, another etching with a hydrofluoric acid-type etchant is performed using a new mask pattern to immediately above the etching stopper layer 110. A series of these processes produces a linearly extending ridge structure having a width of 2 μm on each of the semiconductor laser section 10 and the optical waveguide section 30 as the,ridges 111 and 131. The ridge 131 is formed from the third optical guide layer 105.

Finally, upper and lower electrodes 112 and 113 are formed on the upper face of the ridge 111 of the semiconductor laser section 10 and the bottom face of the substrate 100, respectively.

Next, a method for designing the above-described buried portion 114 of the multimode interference region 20 will be described.

For conciseness, the discussion will focus only on the TE mode of the loser light. Assuming that the semiconductor laser section 10 has a lasing wavelength of λ; the buried portion 114 of the multimode interference region 20 has a thickness of w and a refractive index of $n_r$; and the layers overlying and underlying the buried portion 114 of the multimode interference region 20 have a refractive index of $n_c$, the length L of the buried portion 114 of the multimode interference region 20 can be expressed by eq. 1 below:

$$L = \frac{4n_r}{\lambda}\left[w + \left(\frac{\lambda}{\pi}\right)\frac{1}{\sqrt{n_r^2 - n_c^2}}\right]^2 \qquad \text{Eq.1}$$

The structure is designed so that the center line between the active layer 108 of the semiconductor laser section 10 and the optical waveguide layer 102 of the optical waveguide section 30 is aligned with the center line of the multimode interference region 20 along the height direction (as taken from the top surface of the substrate 100), and that a distance T between the active layer 108 and the optical waveguide layer 102 satisfies eq. 2 below:

$$T = \frac{1}{3}w + \frac{1}{3}\left(\frac{\lambda}{\pi}\right)\frac{1}{\sqrt{n_r^2 - n_c^2}} \qquad \text{Eq.2}$$

In accordance with this structure, the light propagates within the multimode interference region 20 (more precisely, through the buried portion 114 thereof) is translated from the semiconductor laser section 10 to the optical waveguide section 30 as described below.

In accordance with the above-described structure and production method of Example 1, the semiconductor laser section 10 effects laser oscillation in response to a current injection between electrodes 112 and 113 at an oscillation wavelength of 850 nm. The light outgoing from the active layer 108 of the semiconductor laser section 10 enters the multimode interference region 20. Since the multimode interference region 20 (more precisely, the buried portion 114 thereof) has a multimode optical waveguide structure along the vertical direction, the multimode propagation occurs along the vertical direction, while the transverse mode is propagated with a substantially intact light distribution.

FIG. 2 illustrates the light distribution in a cross section taken at A–A' in FIG. 1. Like components are designated with like reference numerals in FIGS. 1 and 2, and therefore descriptions thereof are omitted here.

The distribution of the light outgoing from the semiconductor laser section 10 along the vertical direction has a full width of about 0.9 µm. The incident light at the multimode interference region 20 can be given as a sum of inherent modes of the multimode waveguide. However, since each inherent mode has a different propagation rate, the multimode interference region 20 of a certain length will perform functions such as splitting or translation of the incident light depending on the length of the multimode interference region 20. According to the present example, the length L of the multimode interference region 20 is prescribed at about 670 µm (as calculated from eq. 1 above), so that the light distribution of the light outgoing from the active layer 108 is conserved into the optical waveguide layer 102. Therefore, according to the present example, the light distribution of the outgoing light from the semiconductor laser section 10 enters the optical waveguide layer 102 in a substantially intact state. The ridge 131 provides the optical waveguide section 30 with a refractive index distribution, thereby making for better optical waveguiding characteristics.

Since the light distribution of the optical waveguide section 30 has a full width as large as 2.8 µm, radiation lose due to mode mismatching occurs. Although there is some light absorption in the optical waveguide section 30 because of carrier doping, this can be made negligible by minimizing the length of the optical waveguide section 30.

As described above, according to the present example, the optical waveguide layer 102 of the optical waveguide section 30 and the optical waveguide layer 102 of the semiconductor laser section 10 are produced through the same crystal growth process. As a result, an excellent mode conversion laser element which has substantially no loss due to misalignment of the optical waveguide layer or the like can be provided. By forming the buried portion 114 of the multimode interference region 20 with AlGaAs materials having an aluminum mole fraction of 0.3 or less, an excellent laser element can be provided with substantially no crystal deposition on any mask used.

Although the laser element of the present example is constructed from AlGaAs type materials, the present invention is not limited thereto; it is also possible to adopt other semiconductor materials.

EXAMPLE 2

Example 2 of the present invention will be described with reference to FIG. 3. Specifically, the integrated optical conversion element according to the present example is a mods conversion type laser element which provides for the integration of optical circuit elements with optical coupling at low losses.

Figure 3:
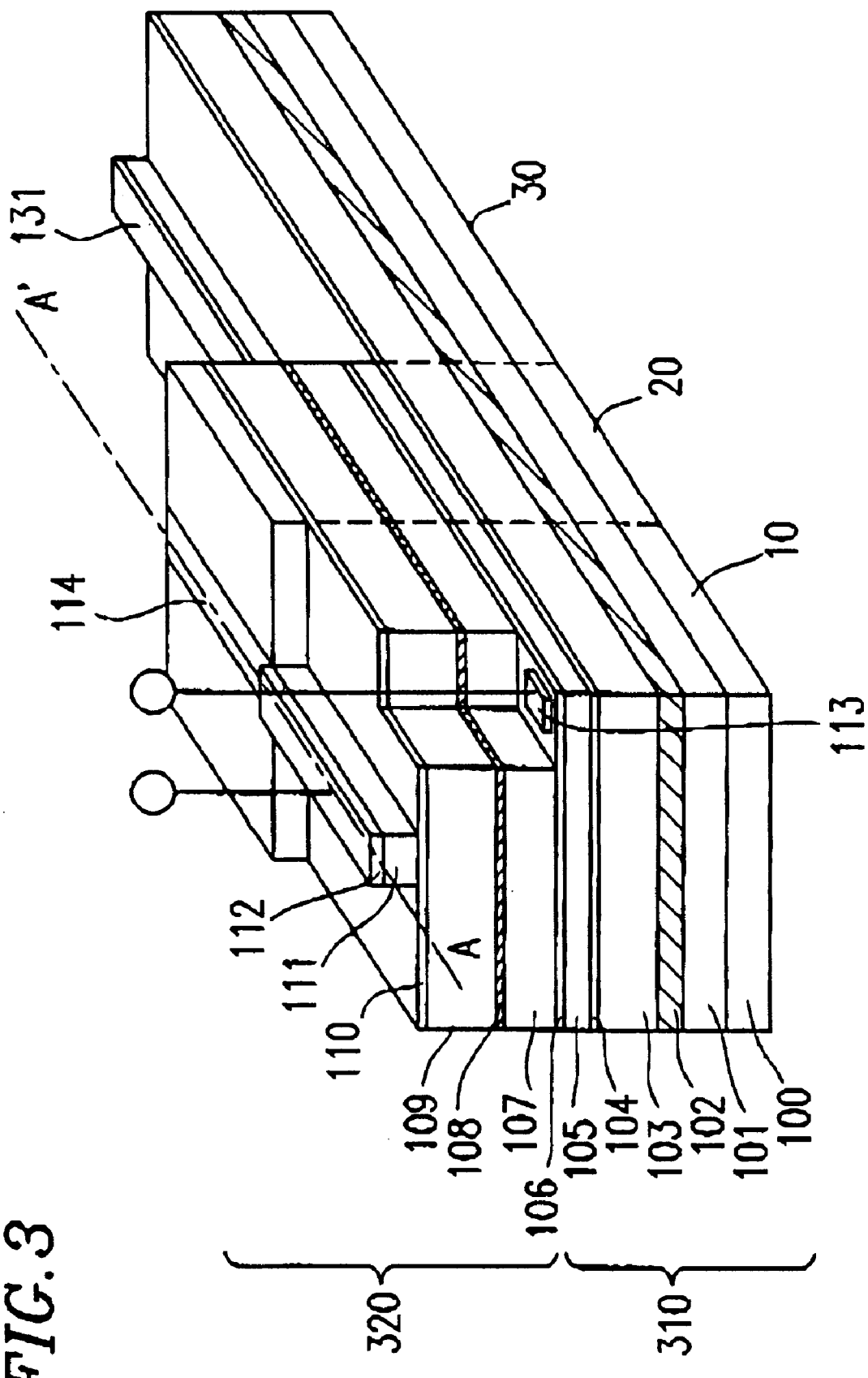
FIG. 3 is a perspective view illustrating A mode conversion type semiconductor laser device as an integrated optical circuit device according to Example 2 of the present invention.

In FIG. 3, the constituent elements which also appear in FIG. 1 are denoted by like numerals.

First, a method for producing the integrated optical circuit device will be described. As in Example 1, in order to form an optical waveguide, an $Al_{0.22}Ga_{0.78}As$ first optical guide layer 101, an $Al_{0.20}Ga_{0.80}As$ optical waveguide layer 102 (thickness: 2 µm), an $Al_{0.22}Ga_{0.78}As$ second optical guide layer 103, an $Al_{0.8}Ga_{0.2}As$ etching stopper layer 104, and an $Al_{0.22}Ga_{0.78}As$ third optical guide layer 105 are layered on a GaAs substrate 100 in this order, by using a usual MOCVD method. These layers are formed as undoped layers. As a result, an optical waveguide is formed in both of a semiconductor laser section 10 and an optical waveguide section 30.

Next, an n-type GaAs electrode bed layer 106 is formed. On this multilayer structure, an n-type $Al_{0.7}Ga_{0.3}As$ first cladding layer 107, an i-type GaAs active layer 108 (thickness: 0.1 µm), a p-type $Al_{0.7}Ga_{0.3}As$ second cladding layer 109, a p-type GaAs etching stopper layer 110, and a p-type third cladding layer 111 are formed in this order, thereby forming a light emitting portion of a semiconductor laser element. As a result, the semiconductor laser section 10 includes a first element region 310 mainly exhibiting a light waveguiding function and a second element region 320 mainly exhibiting a light emitting function, which are stacked in the thickness direction.

Next, the multimode interference region 20 is formed by the same production method as in Example 1 (the description thereof being omitted) except that the multimode interference region 20 of this example has a length of 658 µm.

Next, succeeding processes for producing the semiconductor laser section 10 and the optical waveguide section 30 will be described.

A patterned mask of an $SiO_2$ film (not shown) is provided. By using this mask, the optical waveguide section 30 is etched part of the way into the first cladding layer 107 with a sulfuric acid-type etchant. Thereafter, another etching is performed with a hydrofluoric acid-type etchant until automatically stopped by the n-type GaAs electrode bed layer 106. Concurrently with the etching for the optical waveguide section 30, an etched hole is formed in a position where a lower electrode 113 of the semiconductor laser section 10 is to be provided, by using an appropriate mask pattern.

Thereafter, a ridge 111 of a semiconductor laser section 10 and a ridge 131 of an optical waveguide section 30 are formed by a process similar to that described in Example 1. The ridge 131 of this example is formed from the electrode bed layer 106 and the third light guide layer 105. Finally, upper and lower electrodes 112 and 113 are formed on the upper face of the ridge 111 of the semiconductor loser section 10 and at the bottom of the etched hole produced during the above etching process, respectively.

Hereinafter, the functions of the integrated optical circuit device according to the present example will be described.

The respective refractive indices and geometry of the semiconductor laser section 10 and the optical waveguide section 30 are similar to those described in Example 1. Since a current can be injected through the electrode bed layer 106 in the integrated optical circuit device of the present example, it is possible to effect laser oscillation with a smaller current loss. The light outgoing from the semiconductor laser section 10 enters the multimode interference region 20 and reaches the optical waveguide 30.

Figure 4A:
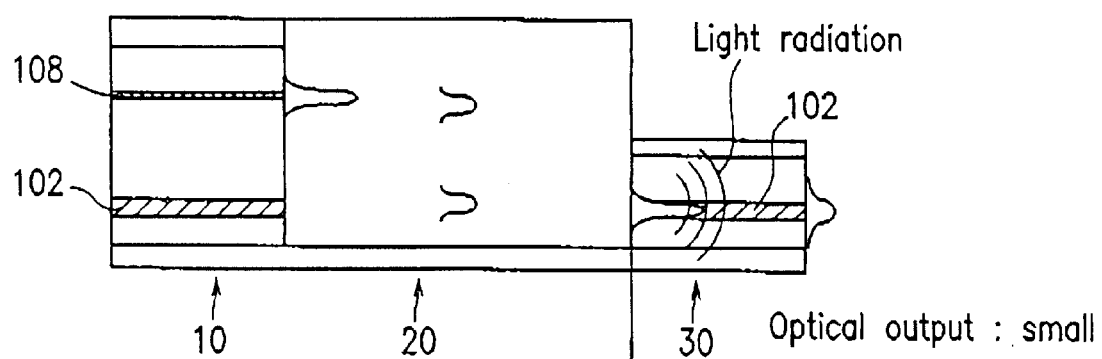
FIG. 4A is a cross-sectional diagram illustrating the operation of the device according to Example 1 of the present invention shown in FIG. 1.
Figure 4B:
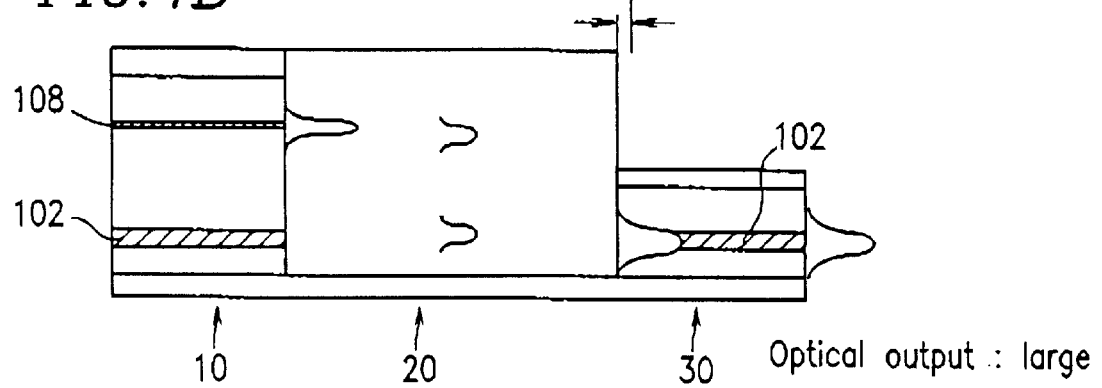
FIG. 4B is a cross-sectional diagram illustrating the operation of the device according to Example 2 of the present invention shown in FIG. 3.

As in Example 1, the multimode interference region 20 conserves, at a position which is at about 670 µm from its interface with the semiconductor laser section 10, the same light distribution as that which is given at the outgoing end face of the semiconductor laser. However, according to the present example, the length L of the multimode interference region 20 is 658 μm, not 670 μm. The reason behind this is described in more detail with reference to FIGS. 4A and 4B. FIG. 4A shows the structure of the integrated optical circuit device according to Example 1, and FIG. 4B shows the structure of the integrated optical circuit device according to the present example. In the figures, the reference numerals for the respective layers are omitted.

In the structure of Example 1 shown in FIG. 4A, the multimode interference region 20 has a length equal to a distance at which the same light distribution as that which is given at the outgoing end face of the semiconductor laser section 10. However, in the structure of the present example, the multimode interference region 20 has a length which is not equal to such a distance as shown in FIG. 4B; specifically, the length is prescribed at a value that maximizes the coupling efficiency between the multimode interference region 20 and the optical waveguide section 30. As a result, as shown in FIG. 4B, the vertical width of the light distribution equals the vertical width of the optical waveguide layer 102, thereby reducing the radiation mode due to mode mismatching.

Figure 5:
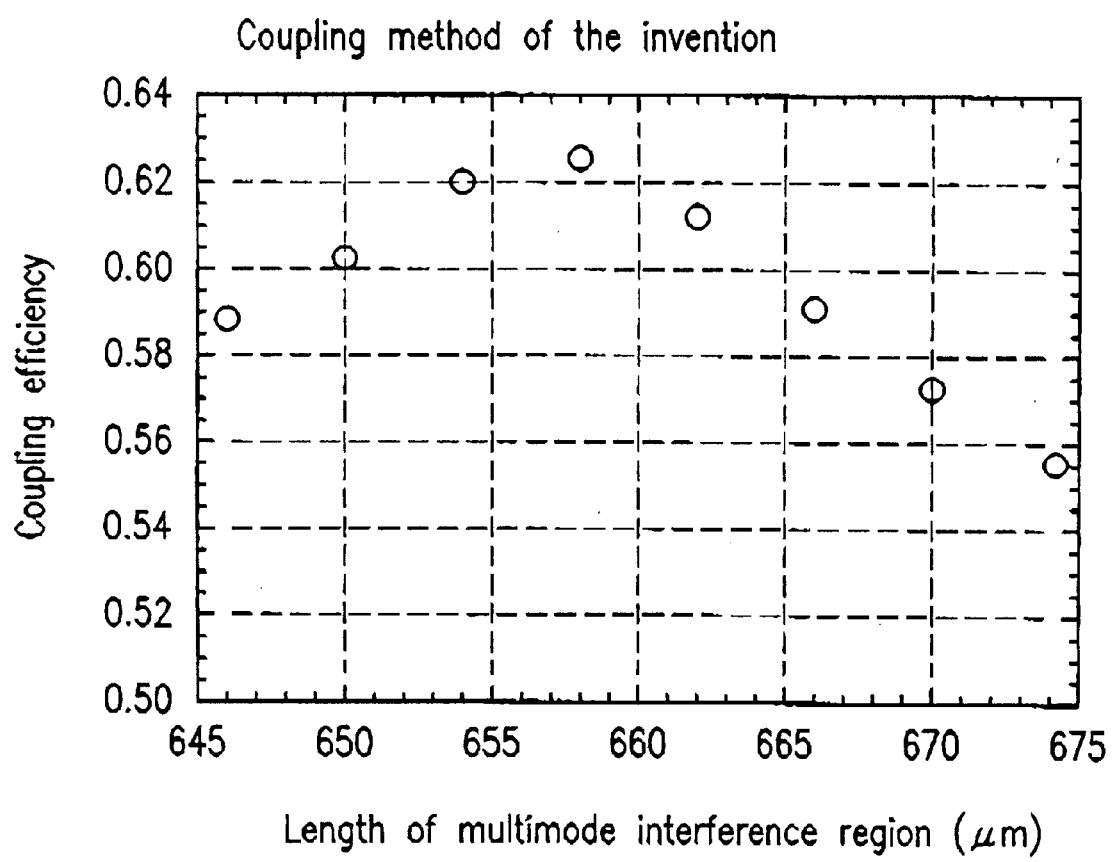
FIG. 5 is graph describing the effects provided according to Example 2 of the present invention.

The inventors of the present invention produced several integrated optical circuit devices with the multimode interference region 20 having various lengths L, and measured the coupling efficiency between the multimode interference region 20 and the optical waveguide section 30 of each device. FIG. 5 shows the measurement results. As seen from FIG. 5, the optimum value of the length L of the multimode interference region 20 that provides a coupling efficiency of 0.60 or above lies within the range of about 651 to 663 μm. This in a specific effect attained by the present invention, in which the vertical widths of light distribution of the semiconductor laser section 10 and the optical waveguide section 30 are different from each other.

Furthermore, in accordance with the device of the present example, the optical waveguide section 30 is undoped, whereby the light absorption in the optical waveguide section 30 can be substantially eliminated.

The electrode bed layer 106 makes it possible to reduce the distance from the electrode 113 to the active layer 108, thereby minimizing the current loss. Although the electrode bed layer 106 extends over the upper surface of the ridge 131 of the optical waveguide section 30, the light which is propagated through the optical waveguide layer 102 does not spread into the electrode bed layer 106 and therefore does not cause large losses.

As described above, in accordance with the integrated optical circuit device of the present example, excellent optical coupling can be provided while minimizing the radiation mode by adjusting the length of the multimode interference region 20 in view of the relationship between the actual light distribution and the intrinsic modes of the optical waveguide layer 102. Since the optical waveguide section 30 is undoped, the light absorption in the optical waveguide section 30 can be substantially eliminated, thereby making it possible to elongate the longitudinal dimension thereof. As a result, it is possible to provide a Y-shaped optical branching circuit or the like in the optical waveguide section 30.

EXAMPLE 3

An integrated optical circuit device according to Example 3 of the present invention will be described with reference to FIG. 6. Specifically, the integrated optical conversion element according to the present example is a mode conversion type laser element which achieves light distribution conversion along the transverse direction in addition to the light distribution conversion along the vertical direction achieved in Examples 1 and 2.

Figure 6:
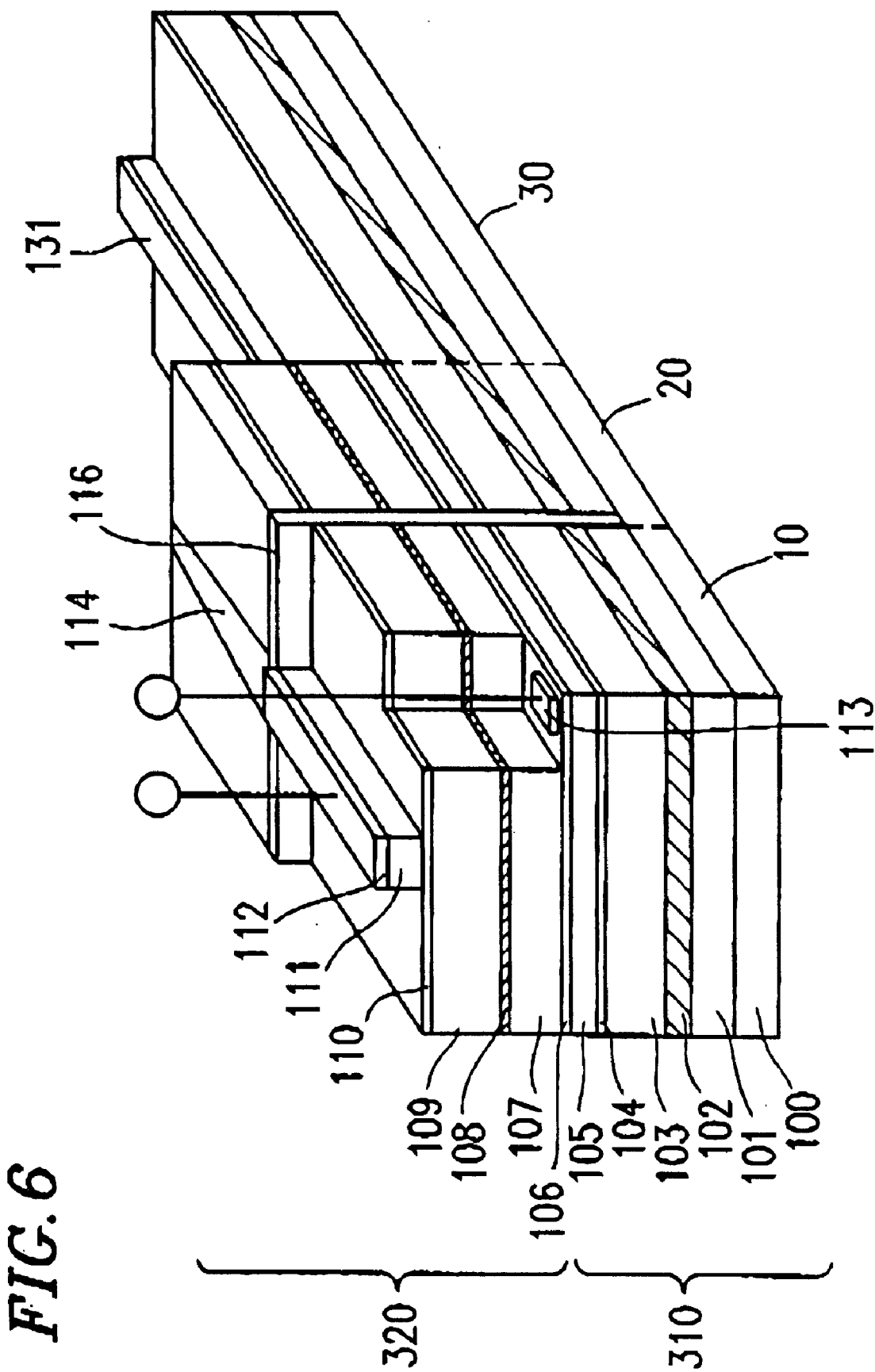
FIG. 6 is a perspective view illustrating a mode conversion type semiconductor laser device as an integrated optical circuit device according to Example 3 of the present invention.

In FIG. 6, the constituent elements which also appear in FIG. 3 are denoted by like numerals, and the descriptions thereof are omitted. The process of producing the integrated optical circuit device of the present example is the same as the process described in Example 2.

In the present example, the multimode interference region 20 has a depth of 4.75 μm, a length of 200 μm, and its buried portion 114 has a gradually varying width between 2 μm (at an and face adjoining the semiconductor laser section 10) and 0.5 μm (at an end face adjoining the optical waveguide section 30).

As shown in FIG. 6, a thin interface layer 116 is formed at an interface between the semiconductor laser section 10 and the multimode interference region 20 in a direction perpendicular to the traveling direction of the laser oscillation light. The formation of the thin interface layer 116 is performed concurrently with the etching and burying processes for forming the buried portion 114 of the multimode interference region 20.

Specifically, the etching is conditioned so as to leave a thickness of 0.25 μm of the n-type first optical guide layer 101. Thereafter, a second MOCVD process is performed so that the thin interface layer 116 and the entire buried portion 114 of the multimode interference region 20 are buried with i-type $Al_{0.15}Ga_{0.85}As$; this is to be contrasted with the structures of Examples 1 and 2, where the uppermost 0.25 μm portion and the lower most 0.25 μm portion of the buried portion 114 of the multimode interference region 20 are formed of $Al_{0.20}Ga_{0.80}As$.

Whereas the width of the ridge 131 of the optical waveguide section 30 is 2 m in Examples 1 and 2, it is 4 μm in the present example. The thickness of the third optical guide layer 105 is prescribed so that a single mode waveguide is realized with a width of 4 μm. Since the buried portion 114 of the multimode interference region 20 of the present example has an asymmetrical confinement structure, the length L of the buried portion 114 of the multimode interference region 20 and the distance T between the active layer 108 and the optical waveguide layer 102 are not directly derived from eq. 1 and eq. 2 above. However, the inventors worked out the optimum structure through computer simulation and the like based on eq. 1 and eq. 2, and confirmed the validity thereof by using an actually produced device.

Hereinafter, the functions of the integrated optical circuit device according to the present example will be described.

The light outgoing from the semiconductor laser section 10 enters the multimode interference region 20. The multimode interference region 20 includes an optical guide layer 101 having an aluminum mole fraction of 0.20 only in the lower portion thereof, with no special layers being provided on the upper portion so that it is directly exposed to the air. As a result, a multimode waveguide structure having an asymmetrical refractive index distribution along the vertical direction can be obtained. By optimizing the length of the multimode interference region 20, the light distribution is translated along the vertical direction so that the light outgoing from the semiconductor laser section 10 is led into the optical waveguide layer 102 of the optical waveguide section 30, as in Examples 1 and 2. On the other hand, the light distribution along the transverse direction is such that light is "kicked out" to the outside as the width of the buried portion 114 gradually decreases, until the full width of the light distribution becomes 5.5 μm at the far end of the multimode interference region 20, where the light distribution coincides with that of the optical waveguide section 30 along the transverse direction.

Since the thin interface layer 116 is formed 80 as to be sufficiently thin, it does not contribute to the transverse expanse of the light. However, the thin interface layer 116 functions as an electric insulation layer for preventing a current injected at the electrode 112 from being leaked out of the semiconductor laser section 10 via the end face. of the buried portion 114 of the multimode interference region 20, the active layer 108, and the first and second cladding layers 107 and 109. The thickness of the thin interface layer 116, which should be minimized as long as it can prevent such current leakage without affecting the expanse (spread) of the light, is typically prescribed at 0.1 μm to 10 μm, preferably 5 μm or less, and more preferably 2 μm or less.

In accordance with the device of the present example, optical coupling along the transverse direction can be attained at a high efficiency by merely changing the mask pattern. Although the width of the buried portion 114 of the multimode interference region 20 has been illustrated to gradually decrease along the traveling direction of the laser light, the same effects can be obtained with stepwise changes. The change in width may have a linear or curved profile, Similar effects can be also provided by increasing the thickness of the buried portion 114 of the multimode interference region 20 in a gradual or stepwise manner along the traveling direction of the laser light.

By forming the i-type thin interface layer 116 between the semiconductor laser section 10 and the multimode interference region 20, an efficient current 10 injection can be realized, thereby lowering the laser oscillation threshold.

EXAMPLE 4

An integrated optical circuit device according to Example 4 of the present invention will be described with reference to FIG. 7.

Figure 7:
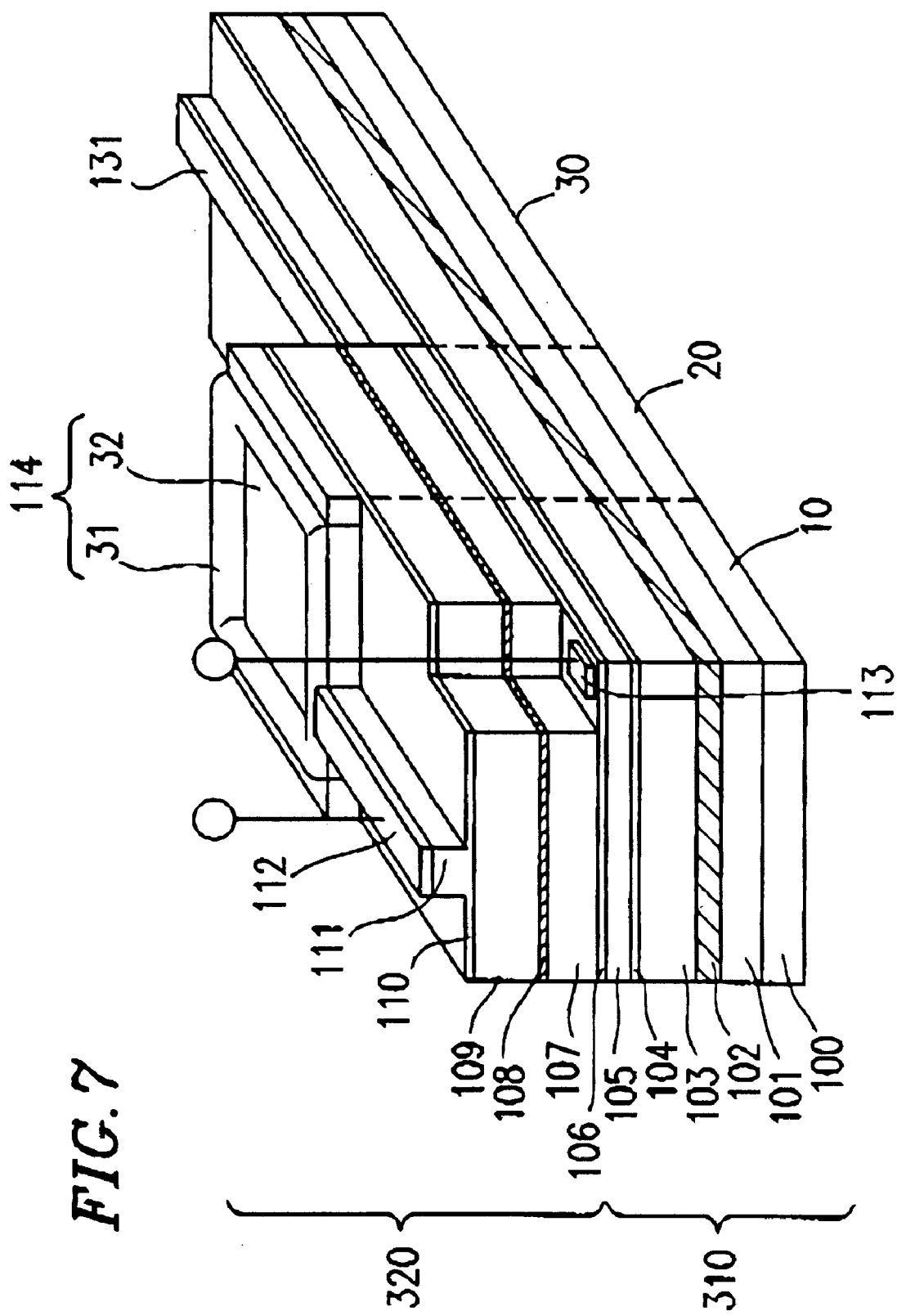
FIG. 7 is a perspective view illustrating a mode conversion type semiconductor laser device as an integrated optical circuit device according to Example 4 of the present invention.

In FIG. 7, the constituent elements which also appear in FIG. 3 are denoted by like numerals, and the description thereof is omitted. The process of producing the integrated optical circuit device of the present example is basically the same as the process described in Example 2 except that a buried portion 114 of the multimode interference region 20 is formed so as to be as wide as 15 μm according to the present example. The center line of the ridge 111 of the semiconductor laser section 10 and the center line of the ridge 131 of the optical waveguide section 30 are arranged so as to have an offset of 6.3 μm along the width direction, and are located in line symmetry with respect to the center of the transverse direction of the multimode interference region 20.

Hereinafter, the functions of the integrated optical circuit device according to the present example will be described.

Figure 8:
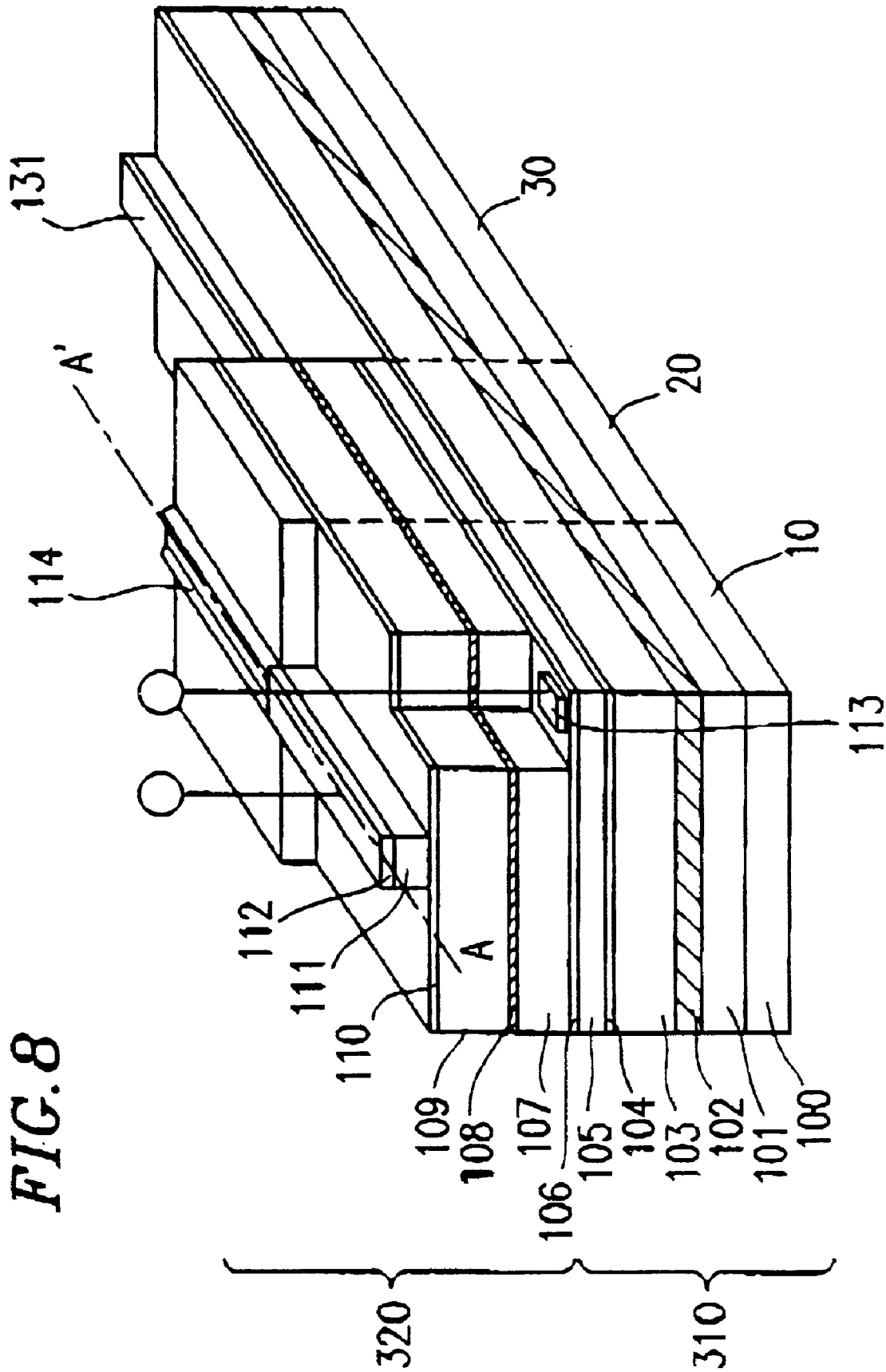
FIG. 8 is a perspective view illustrating problems to be solved by Example 4 of the present invention.

According to Examples 1 to 3, the width of the buried portion 114 of the multimode interference region 20 is as narrow as 0.5 to 2 μm. Therefore, as schematically shown in FIG. 8, convex or concave portions may be formed at the interfaces between the buried portion 114 and the non-buried portions, thereby detracting from planarity of such portions. In such cases, the distribution of the intrinsic mode in the buried portion 114 of the multimode interference region 20 may slightly change so that the coupling efficiency deteriorates. On the other hand, the integrated optical circuit device of the present example incorporates an buried portion 114 spreading in both vertical and transverse directions, so that the region in which light is effectively distributed is buried flat.

Figure 9:
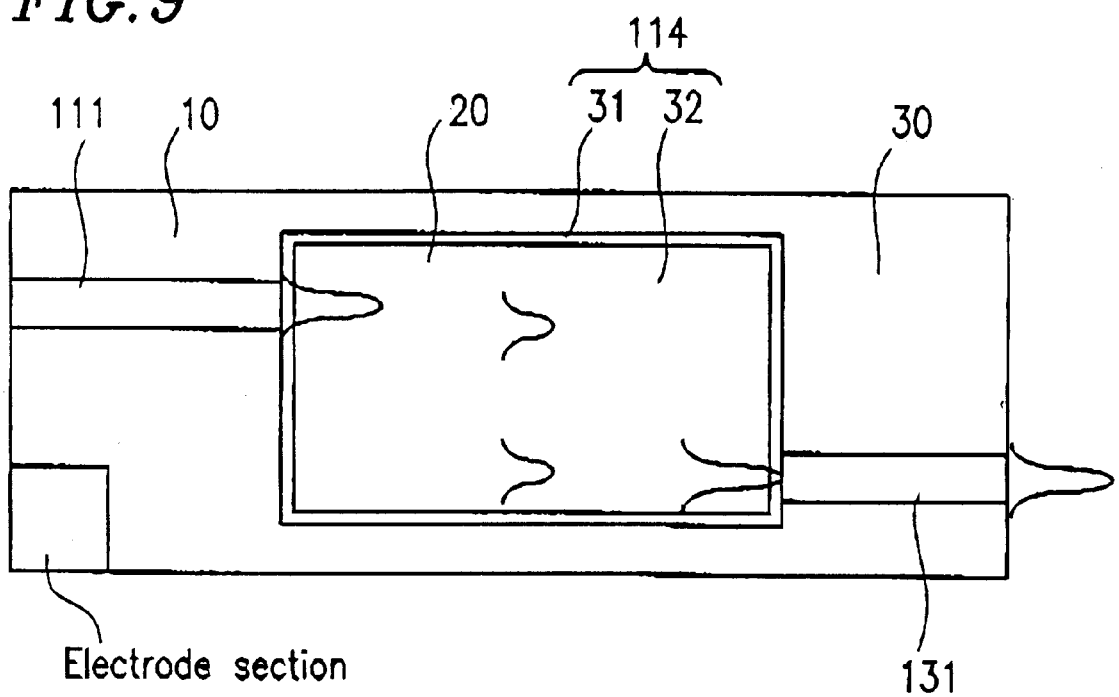
FIG. 9 is a cross-sectional diagram illustrating the operation of the device according to Example 4 of the present invention shown in FIG. 7.

FIG. 9 is a plan view showing the light distribution in the multimode interference region 20 (more precisely, in the buried portion 114 thereof) according to the present example.

The light which has been emitted from the semiconductor laser section 10 passes a non-flat-buried region 31 other than the flat-buried region which exists in the interspace between the semiconductor laser section 10 is and the multimode interference region 20 (or the interspace between the multimode interference region 20 and the optical waveguide section 30) immediately after outgoing from the semiconductor laser section 10 (or immediately before entering the optical waveguide section 30). However, such regions,31 span only a short distance so that they will not substantially affect the light distribution. In contrast with the structure illustrated in FIG. 8, the light in the multimode interference region 20 is distributed not immediately below the non-flat-buried regions 31 but only in the flat-buried regions 32. As a result, the light distribution is susceptible to no unfavorable effects.

Thus, according to the present example, the problem associated with non-flat-buried region in the buried portion 114 arising upon the crystal growth process for forming the buried portion 114 of the multimode interference region 20 is prevented, thereby minimizing the decrease in coupling efficiency. In addition, it becomes unnecessary to perform an extra process for planarizing the buried portion 114.

Although the light distribution has substantially the same width along the transverse direction in the semiconductor laser section 10 and the optical waveguide section 30 in the above example, good optical efficiency can still be attained by optimizing the length of the multimode interference region 20 even if the width is not the same.

EXAMPLE 5

An integrated optical circuit device according to Example 5 of the present invention will be described with reference to FIG. 10.

Figure 10:
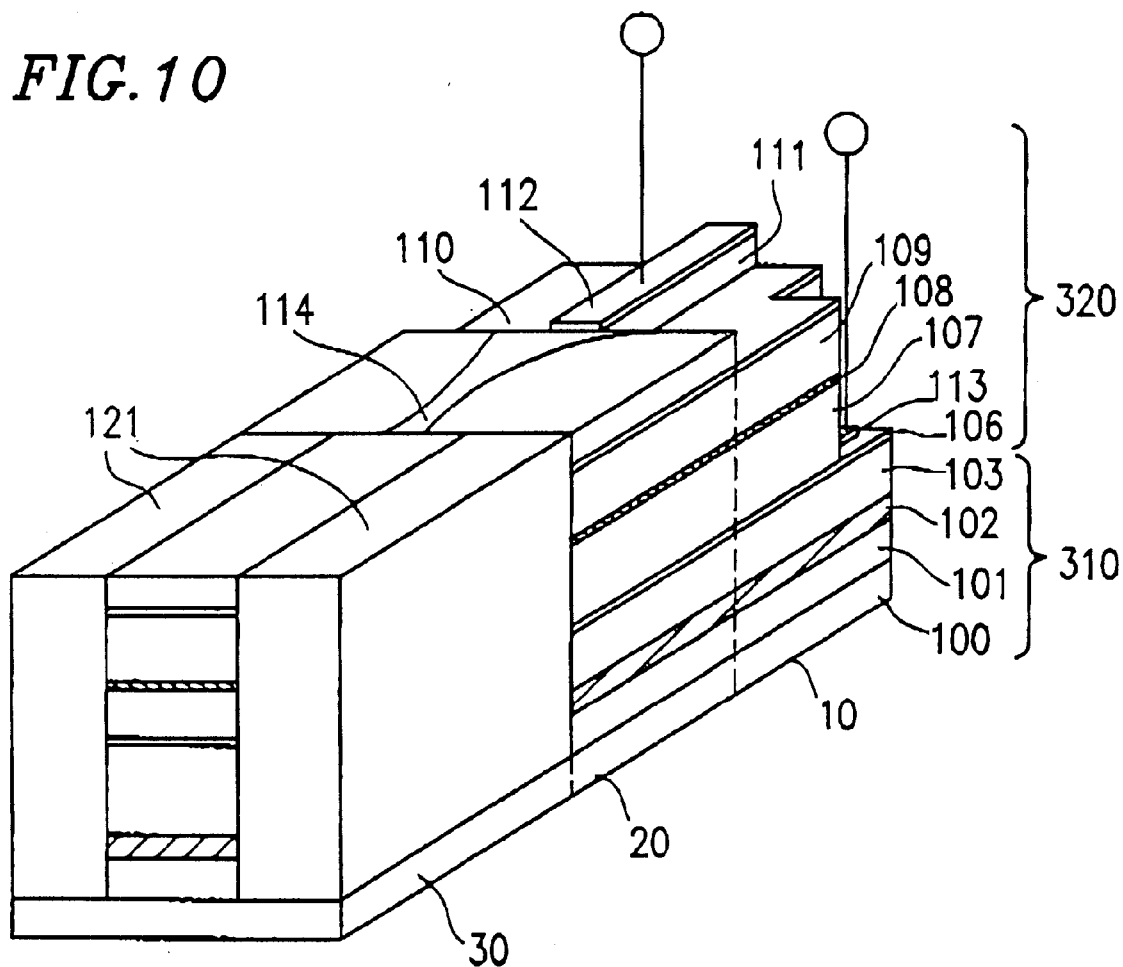
FIG. 10 is a perspective view illustrating a mode conversion type semiconductor laser device as an integrated optical circuit device according to Example 5 of the present invention.

In FIG. 10, the constituent elements which have been illustrated in Examples 1 to 4 are denoted by like numerals.

First, a method for producing the integrated optical circuit device will be described. As in Example 1, in order to form an optical waveguide, an $Al_{0.22}Ga_{0.78}As$ first optical guide layer 101, an $Al_{0.20}Ga_{0.80}As$ optical waveguide layer 102 (thickness: 2 μm), and an $Al_{0.22}Ga_{0.78}As$ second optical guide layer 103 are layered on a GaAs substrate 100 in this order, by using a usual MOCVD method. These layers are formed as undoped layers. As a result, an optical waveguide is formed in both of a semiconductor laser section 10 and an optical waveguide section 30.

Next, an n-type GaAs electrode bed layer 106 is formed. On this multilayer structure, an n-type $Al_{0.7}Ga_{0.3}As$ first cladding layer 107, an i-type GaAs active layer 108 (thickness: 0.1 μm), a p-type $Al_{0.7}Ga_{0.3}As$ second cladding layer 109, a p-type GaAs etching stopper layer 110, and a p-type third cladding layer 111 are formed in this order, thereby forming a light emitting portion of a semiconductor laser element. As a result, the semiconductor laser section 10 includes a first element region 310 mainly exhibiting a light waveguiding function and a second element region 320 mainly exhibiting a light emitting function, which are stacked in the thickness direction.

Next, an RIBE etching is performed in order to form the multimode interference region 20. The etching mask pattern is arranged to also etch away side portions 121 in the optical waveguide section 30 so that a mesa structure will be concurrently formed in the optical waveguide section 30 which is linearly aligned with the ridge 111 of the semiconductor laser section 10 and the buried portion 114 of the multimode interference region 20. Preferably, in this etching process, an etched hole in which a lower electrode 113 for the semiconductor laser section 10 is to be formed is also concurrently formed, as in Example 2.

As in Example 1, a RIBE etching is performed until reaching the GaAs substrate 100. The resultant etched groove is buried with AlGaAs to form the buried portion 114. For the uppermost 0.25 μm portion and the lowermost 0.25 μm portion of the buried portion 114, the AlGaAs layer has an Al mole fraction of 0.29; for the other portions, the AlGaAs layer has an Al mole fraction of 0.24. Both of the side portions 121 of the mesa structure in the optical waveguide section 30 are also buried in the above burying process, concurrently with the buried portion 114.

As shown in FIG. 10, the buried portion 114 of the multimode interference region 20 is arranged so as to have a gradually changing width, the change in width becoming smaller in regions of narrow widths. As a result, an improved mode conversion efficiency can be provided for the same Length of the multimode interference region 20, as compared to the case where the width of the buried portion 114 linearly changes.

The Al mole fraction for the buried portion 114 of the multimode interference region 20 is prescribed at a higher value than the Al mole fraction for the optical waveguide layer 102. As a result, the light confinement along the transverse direction becomes an antiguide mode so that a loss due to leaked light waves is present in this region, but the amount of lose is on the order of 0.1 dB/100 μm, which is negligible. In the optical waveguide section 30, a guide structure is provided along both the vertical and transverse directions so that a single mode optical waveguide is formed.

Thus, according to the present example, there is provided an integrated optical circuit device which attains high optical coupling from the semiconductor laser section 10 into the optical waveguide section 30 and which does not require the formation of a ridge in the optical waveguide section 30. In the case where the length of the optical waveguide section 30 is sufficiently short, it is possible to utilize the optical waveguide section 30 as an antiguide by prescribing the Al mole fraction for the buried portion 114 of the multimode interference region 20 at a lower value than the Al mole fraction for the optical waveguide layer 102. In such cases as well, the propagation loss due to leaked light waves is on the order of 0.1 dB/100 μm, which is negligible.

By burying the buried portion 114 of the multimode interference region 20 and both sides 121 of the mesa structure in the optical waveguide section 30 with semiconductor materials having different Al mole fractions from each other, it becomes possible to provide a guide structure in both the multimode interference region 20 and the optical waveguide section 30, whereby an integrated optical circuit device can be provided which has low losses and can be integrated with other optical elements. Such a structure is also encompassed by the present invention: the present invention is not limited to the transverse light confinement method.

EXAMPLE 6

An integrated optical circuit device according to Example 6 of the present invention will be described. Specifically, the integrated optical circuit device of the present example is a mode conversion type laser element.

Figure 11A:
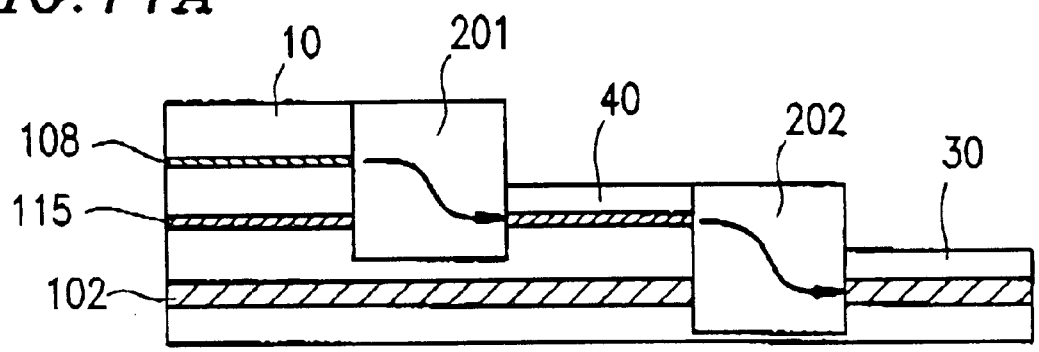
FIG. 11A is a perspective view illustrating one structure of a mods conversion type semiconductor laser device as an integrated optical circuit device according to Example 6 of the present invention.

FIG. 11A is a cross sectional view taken at a plane intersecting the buried portion 114 of the multimode interference region 20 (corresponding to A–A' in FIG. 1). The device of the present invention can be formed by a conventional process or any of the processes described in Examples 1 to 5 except that an optical buffer section 40 is provided between the semiconductor laser section 10 and the optical waveguide section 30. The optical buffer section 40 and the semiconductor laser section 10 is coupled by a multimode interference region 201, whereas the optical buffer section 40 and the semiconductor laser section 30 is coupled by a multimode interference region 202. The coupling via the multimode interference regions 201 and 202 effectively eliminates problems associated with the positional offset between optical waveguide layers and/or the presence of extra layers, thereby providing an advantage over the conventional structures because the coupling efficiency does not deteriorate through coupling between multiple stages.

Now, the advantages provided by the structure of the present example will be described.

Assuming that the semiconductor laser section 10 and the optical waveguide section 30 have light distribution widths $w_1$ and $w_3$, respectively, the coupling efficiency $\eta_1$ obtained in the case where no optical buffer section 40 is provided can be substantially expressed by eq. 3:

$$\eta_1 = \frac{2}{\frac{W1}{W3} + \frac{W3}{W1}} \qquad Eq.3$$

On the other hand, the coupling efficiency $\eta_2$ obtained in the case where the optical buffer section 40 of the present example is provided, assuming that the optical buffer section 40 has a light distribution width $w_2$, can be expressed by eq. 4:

$$\eta_2 = \frac{2}{\frac{W1}{W2} + \frac{W2}{W1}} \times \frac{2}{\frac{W2}{W3} + \frac{W3}{W2}} \qquad Eq.4$$

Accordingly, in the case where the semiconductor laser section 10 and the optical waveguide section 30 have greatly different light distribution widths ($w_3 \gg w_1$), the value of $w_2$ can be prescribed in accordance with eq. 5:

$$w_2 = \sqrt{w_1 w_3} \qquad Eq. 5$$

As a result, the coupling efficiency $\eta_2$ according to the present example (expressed by eq. 4) can be improved to about twice as high as the coupling efficiency $\eta_1$ obtained in the case where no optical buffer section 40 is provided (expressed by eq. 3).

According to the present example, as a result of providing the optical buffer section 40 in a structure including a semiconductor laser section 10 and an optical waveguide section 30 having the same light distribution widths as those in the structure of Example 1, the coupling efficiency is improved to about 1.4 times as high as the coupling efficiency obtained in the case where no optical buffer section 40 is provided. Accordingly, the optical waveguide section 30 can be formed through the same process used for the semiconductor laser section 10, so that excellent optical coupling is achieved without degrading the crystal quality during regrowth. This effect associated with the multiple stage coupling is provided by the tapered coupling. Thus, an integrated optical circuit device can be realized which has a higher reliability than that attained by conventional techniques.

Figure 11B:
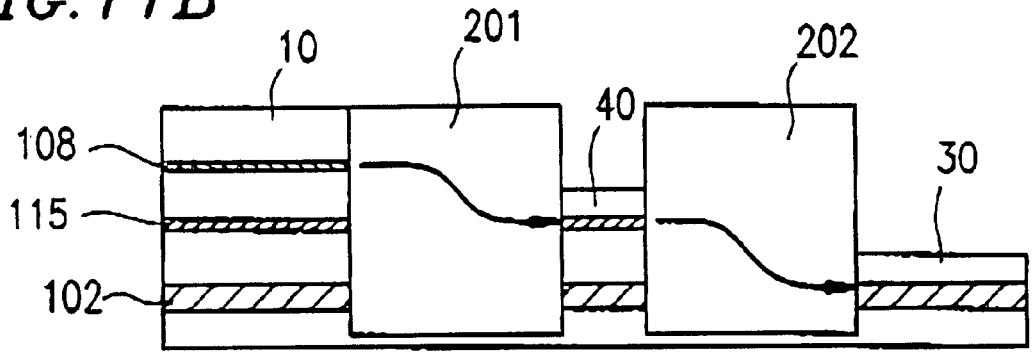
FIG. 11B is a perspective view illustrating a modified structure of a mode conversion type semiconductor laser device as an integrated optical circuit device according to Example 6 of the present invention.

FIG. 11B shows a modified structure according to the present example, in which two multimode interference regions 201 and 202 are formed 90 as to have the same depth. In this case, too, the same effects can be provided by optimizing the lengths of the two multimode interference regions 201 and 202. The structure of FIG. 11B provides an advantage in that the etching processes and burying processes for the two multimode interference regions 201 and 202 can be performed simultaneously.

Although a structure has been illustrated in which the multiple stage coupling is realized by the use of the optical buffer section 40 interposed between the semiconductor laser section 10 and the optical waveguide section 30, the applications of the present example are not limited thereto. For example, the present example is also applicable to the coupling between optical waveguides having different thicknesses; such a structure is also encompassed by the scope of the invention.

EXAMPLE 7

An integrated optical circuit device according to Example 7 of the present invention will be described. Specifically, the present example relates to another method of producing the integrated optical circuit device of Example 1, which results in improved characteristics as compared with those obtained according to Example 1.

In the following description, the constituent elements which have been illustrated in Examples 1 to 6 are denoted by like numerals.

First, a method for producing the integrated optical circuit device will be described. As in Example 1, layers 101 to 105 for forming an optical waveguide are layered in this order on a GaAs substrate 100 by a usual MOCVD method. As a result, an optical waveguide is formed in both the semiconductor laser section 10 and the optical waveguide section 30. Next, layers 107 to 111 for forming a light emitting portion of a semiconductor laser element are layered in this order on this multilayer structure.

Figure 12A:
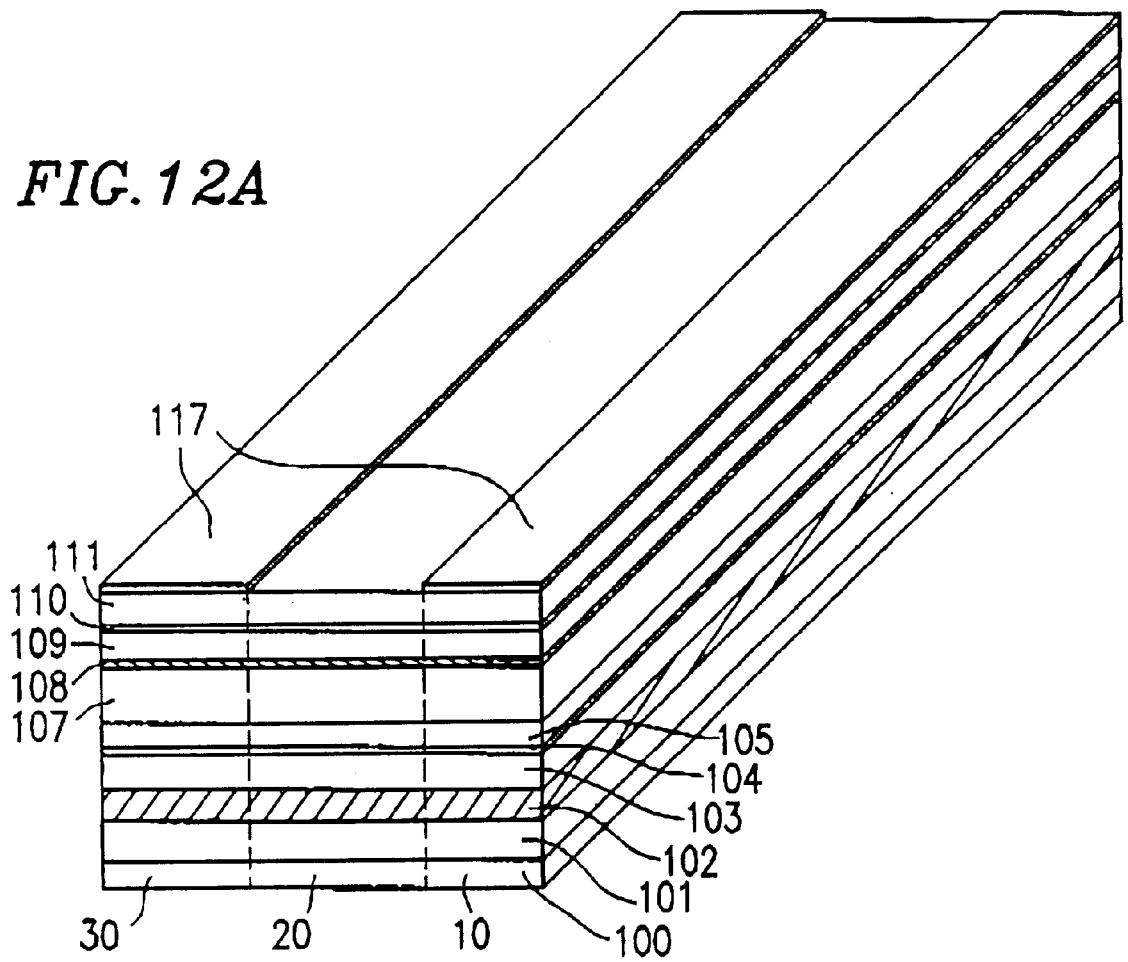
FIG. 12A is a schematic perspective view illustrating a step in a method for producing an integrated optical circuit device according to Example 7 of the present invention.

Next, as shown in FIG. 12A, an $SiO_2$ mask 117 is patterned onto the layer 111. By using this mask, a RIBE etching for forming the multimode interference region 20 is performed until reaching the GaAs substrate 100. The bottom of the resultant etched groove may be further flattened by further performing a wet etching or the like after the RIBE etching. Thereafter, a selective MOCVD growth process is conducted so as to obtain three AlGaAs growth layers to later form the buried portion 114 of the multimode interference region 20 (see FIG. 12B, although the three layers are not separately illustrated therein). The respective thicknesses and compositions of the three AlGaAs layers forming the buried portion 114 are prescribed at the same values as in Example 1.

Figure 12B:
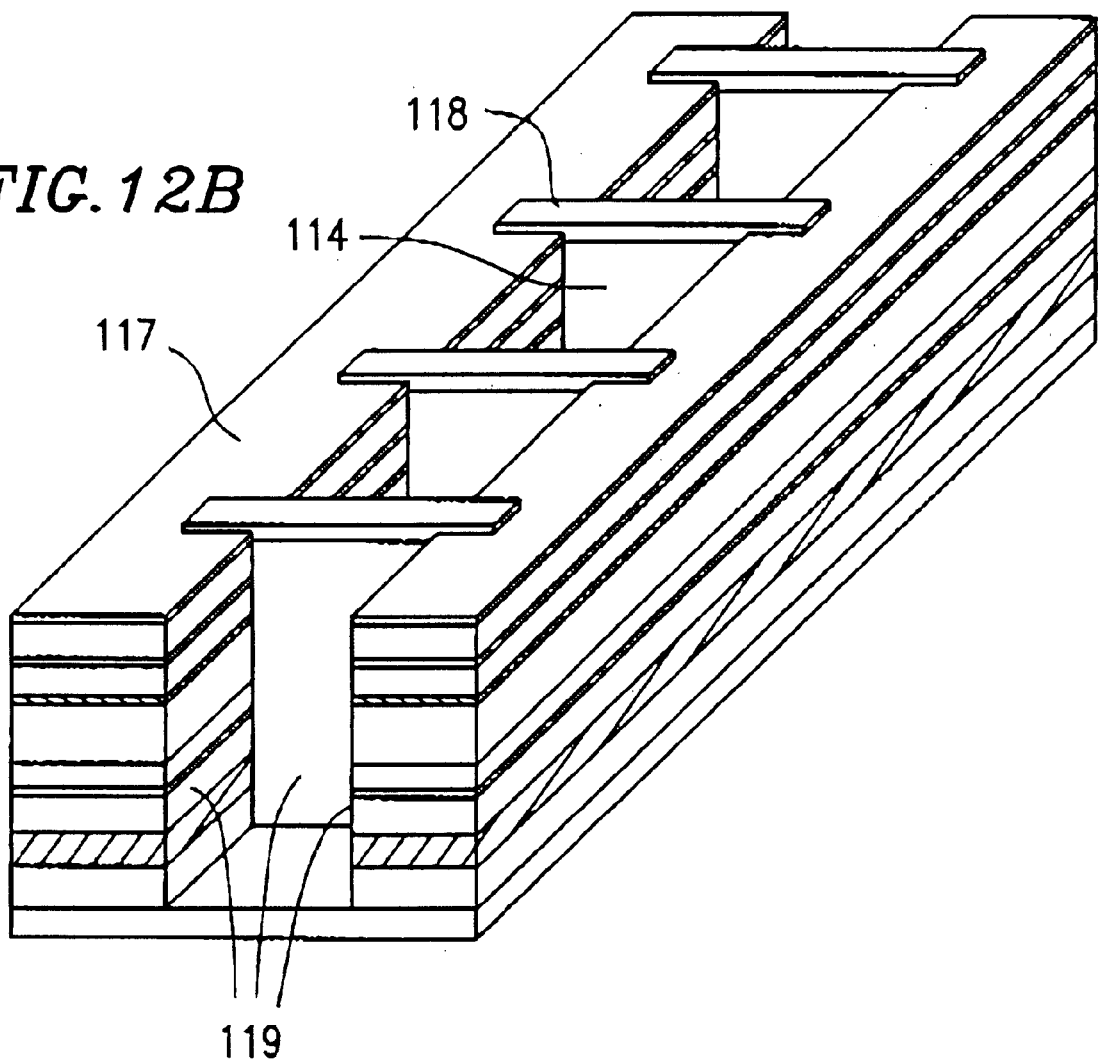
FIG. 12B is a schematic perspective view illustrating another step in the method for producing an integrated optical circuit device according to Example 7 of the present invention.

Furthermore, referring to FIG. 12B, an $SiO_2$ film pattern 118 is formed above the buried portion 114 of the multimode interference region 20 so as to couple the semiconductor laser section 10 and the optical waveguide section 30. The previously formed $SiO_2$ mask 117 and the $SiO_2$ pattern 118 are used to perform another RIDE etching to leave only a portion of the buried three AlGaAs layers corresponding to the buried portion 114 of the multimode interference region 20, thereby forming a transverse light confinement structure in the multimode interference region 20 as shown in FIG. 12B.

Thereafter, ridges 111 and 131 are formed in the semiconductor laser section 10 and the optical waveguide section 30, respectively, through a process similar to Example 1. In order to prevent a so-called "side etching" of the buried portion 114 of the multimode interference region 20 and/or exposed lateral faces 119 of the semiconductor laser section 10 and the optical waveguide section 30 during the wet etching performed for forming the ridges 111 and 131, a protective film (e.g., an $SiO_2$ film) which covers the exposed lateral faces 119 may be formed prior to the etching, or alternatively, side regions 128 of the buried portion 114 (see FIG. 12C) can be buried with a suitable material such as a semiconductor material or polyimide. However, when such a burying process is performed, it requires optimizing the width of the buried portion 114 in accordance with the specific type of material used for burying the side regions 128 of the buried portion 114 for the sake of stabilizing the transverse mode in the multimode interference region 20. In the present example, the side regions 128 of the buried portion 114 may be buried with a semiconductor material, e.g., $Al_{0.18}Ga_{0.82}As$.

Finally, an upper electrode 112 is formed on the upper face of the ridge 111 of the semiconductor laser section 10. A lower electrode (not shown) is formed on the lower face of the substrate to accomplish the structure shown in FIG. 12C.

Figure 12C:
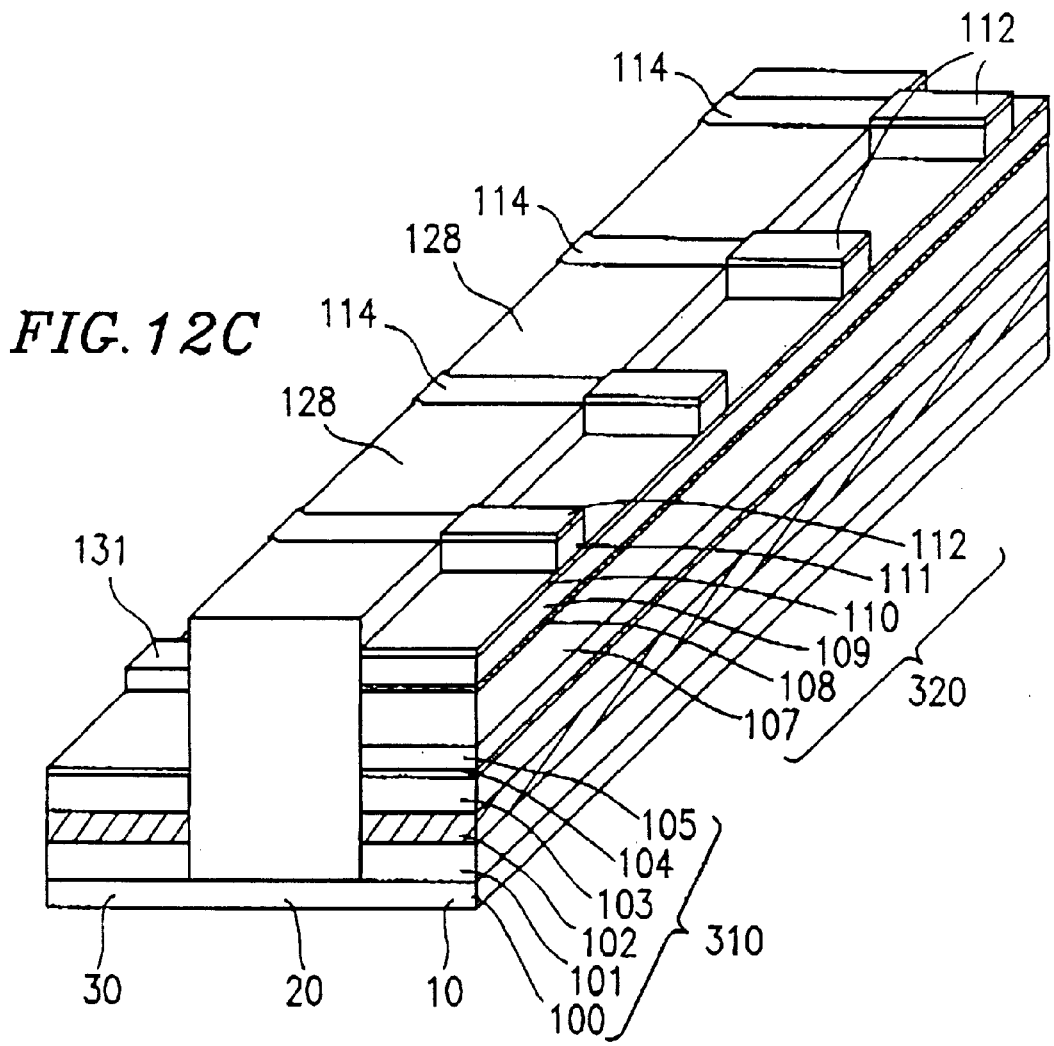
FIG. 12C is a schematic perspective view illustrating still another step in the method for producing an integrated optical circuit device according to Example 7 of the present invention.
Figure 12D:
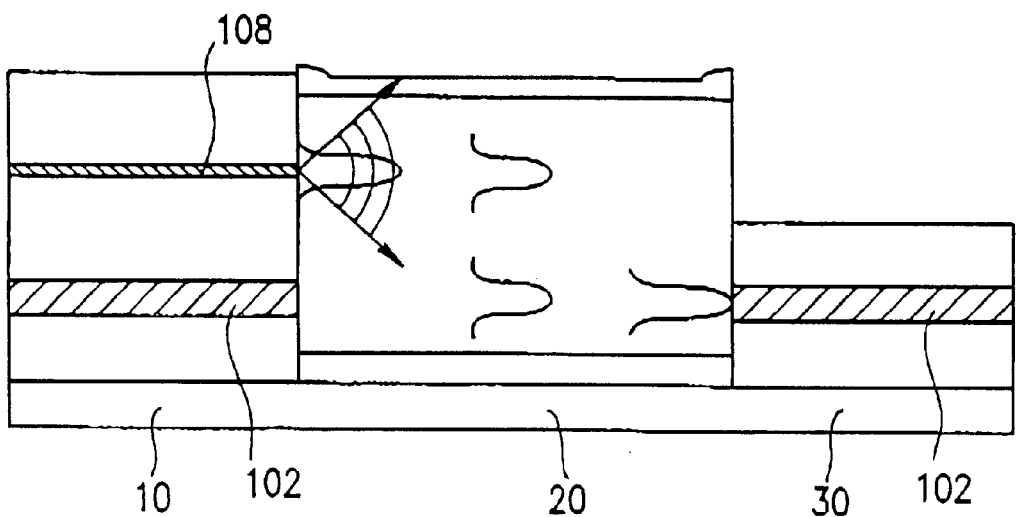
FIG. 12D is a cross-sectional view illustrating the operation of a device formed by the method according to Example 7 of the present invention.

In the case of utilizing the above-described selective growth, it is known that the growth layer may become thick at the interface between the growth region and the non-growth region (i.e., masked region), as schematically shown in FIG. 12C or 12D. However, in accordance with the production process of the present example, the burying width along the transverse direction becomes sufficiently large during the formation of the buried portion 114 of the multimode interference region 20. Therefore, as seen from FIGS. 12C and 12D, the region where the flat burying cannot be realized is limited to the very vicinity of the interface between the semiconductor laser section 10 and the optical waveguide section 30 or the multimode interference region 20. Therefore, the thickness of the buried portion 114 of the multimode interference region 20 does not substantially change along the transverse direction.

In this case, as shown in FIG. 12D, the light outgoing from the semiconductor laser section 10 is guided into the multimode interference region 20 and thereafter reflected from the overlying and underlying layers. However, the actual reflection occurs in the central portion in the longitudinal direction of the multimode interference region 20. Since the central portion of the multimode interference region 20 is buried substantially flat according to the present example, desirable reflection is realized so that the light outgoing from the semiconductor laser section 10 is efficiently coupled into the optical waveguide section 30.

EXAMPLE 8

Hereinafter, Example 8 of the present invention will be described. Specifically, the present example relates to another method of producing the integrated optical circuit device of Example 1, which results in improved characteristics as compared with those obtained according to Example 1. In the following description, the constituent elements which have been illustrated in Examples 1 to 7 are denoted by like numerals.

As described above in connection with Example 7, the device characteristics improve by making the buried portion 114 of the multimode interference region 20 so as to be flat.

The present example illustrates a process which will provide a further flattened buried portion 114.

By using a usual MOCVD method, three AlGaAs layers 21 to 23 are formed on a GaAs substrate 100. The respective thicknesses and compositions of the three AlGaAs layers 21 to 23 are prescribed at the same values as in Example 1. At this point, the upper face and the lower face of the buried portion 114 of the multimode interference region 20 are flat surfaces.

Next, an SiO$_2$ mask 117 of a suitable shape for ensuring that the length of the multimode interference region 20 (i.e., length within the plane of FIG. 13A) becomes 658 μm as in the structure of Example 2 is patterned onto the uppermost AlGaAs layer 23. By using the SiO$_2$ mask 117, portions other than the multimode interference region 20 are subjected to a substantially vertical RIBE etching until reaching the GaAs substrate 100.

Then, in order to form the semiconductor laser section 10 and the optical waveguide section 30, an SiO$_2$ film 117a surrounding the side faces of the multimode interference region 20 is formed by a bias sputtering method. By this bias sputtering, which is performed while applying an optimum bias voltage to the substrate 100, loss and formation of the SiO$_2$ film due to ion irradiation compete on the bottom face of the etched region, so that no SiO$_2$ film can be substantially formed. Therefore, the SiO$_2$ film 117a is formed only on the side faces of the multimode interference region 20.

The SiO$_2$ mask 117, which is still remaining after use during the RIBE etching, is also susceptible to the similar loss and formation during the bias sputter process, but the thickness thereof tends to decrease rather than increase. Therefore, the SiO$_2$ mask 117 should preferably be formed so as to be correspondingly thicker.

Next, on the surface of the substrate 100 which has been exposed during the above process, layers 101 to 105 for forming an optical waveguide as in Example 1 are sequentially layered by using a MOCVD selective growth method. As a result, an optical waveguide is formed in both the semiconductor laser section 10 and the optical waveguide section 30. Then, layers 107 to 111 for forming a light emitting portion of a semiconductor laser element are sequentially formed on the resultant multilayered structure. As a result, the semiconductor laser section 10 includes a first element region 310 mainly exhibiting a light waveguiding function and a second element region 320 mainly exhibiting a light emitting function, which are stacked in the thickness direction.

Figure 13A:
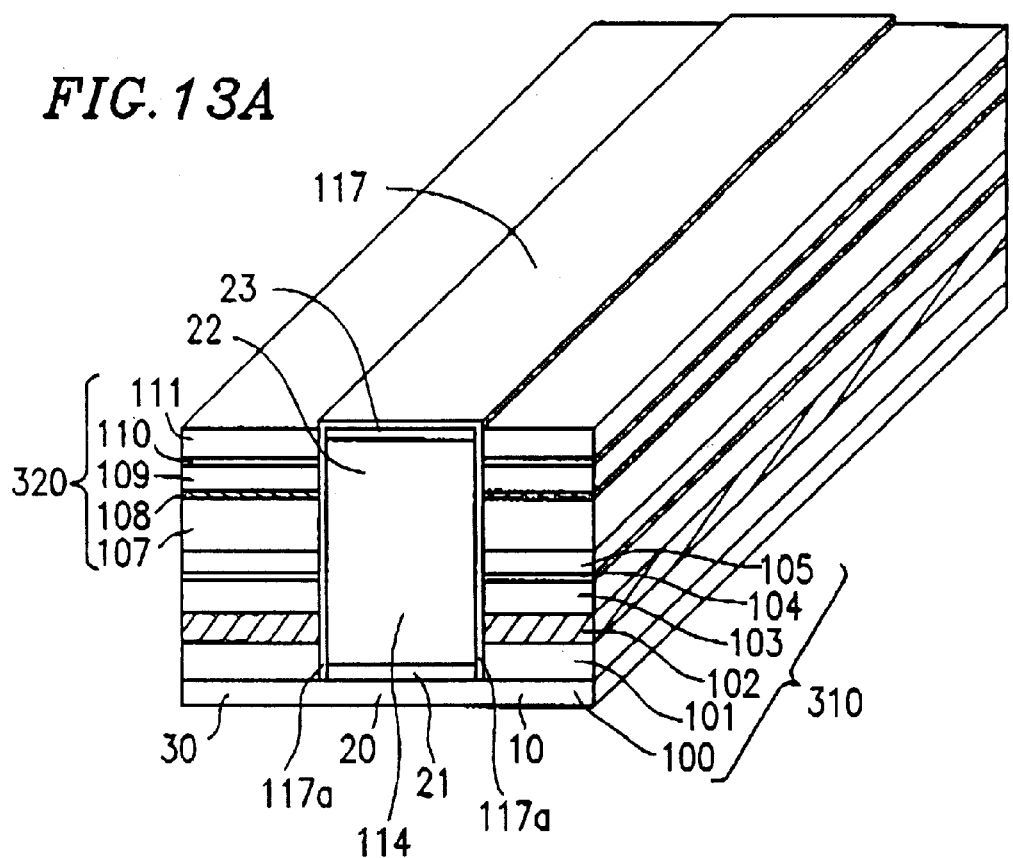
FIG. 13A is a schematic perspective view illustrating a step in a method for producing an integrated optical circuit device according to Example 8 of the present invention.

During selective growth, no crystal growth occurs on the SiO$_2$ layer 117. Consequently, the layers 101 to 105 and layers 107 to 111 are formed so as to be substantially horizontal, as shown in FIG. 13A.

Thereafter, as described in Example 7, a portion of the layered structure including the three AlGaAs layers 21 to 23 is etched away and then is buried with polyimide for light confinement along the transverse direction in the multimode interference region 20. Then, the previously mentioned ridge formation process is performed to obtain the final structures of the semiconductor laser section 10 and the optical waveguide section 30.

In accordance with the production process of the present example, the AlGaAs layers 21 to 23 forming the buried layer 114 of the multimode interference region 20 are formed so as to lie flat on the flat surface of the GaAs substrate 100. As a result, the characteristics of the multimode interference region 20 are improved.

In the above description, the substantially parallel growth layers 107 to 111 are obtained through selective growth techniques in order to form the semiconductor laser element as one of the optical elements to be integrated. However, in the case where high coupling efficiency is not required for coupling the multimode interference region 20 with an optical element to be integrated therewith, another growth process such as bias sputtering may be employed for forming the necessary growth layers, instead of the selective growth method.

Figure 13B:
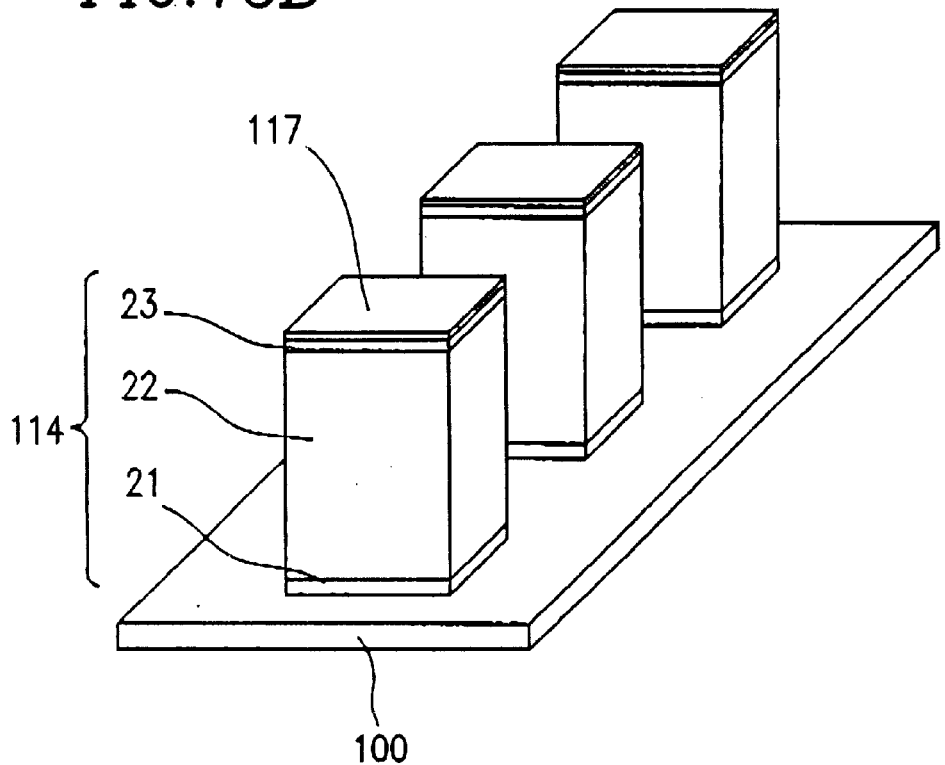
FIG. 13B is a schematic perspective view illustrating a step in another method for producing an integrated optical circuit device according to Example 8 of the present invention.
Figure 13C:
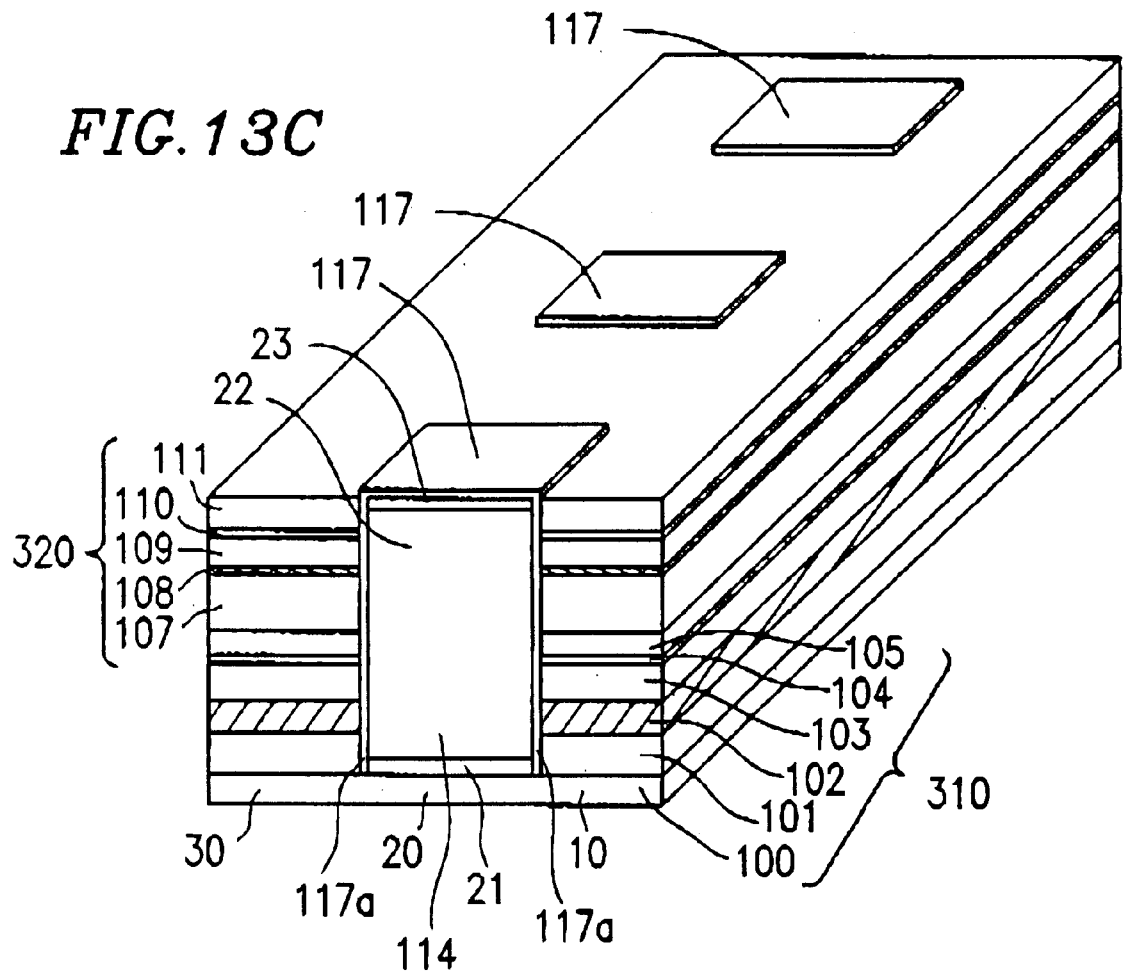
FIG. 13C is a schematic perspective view illustrating a subsequent step in the method shown in FIG. 13B.
Figure 14:
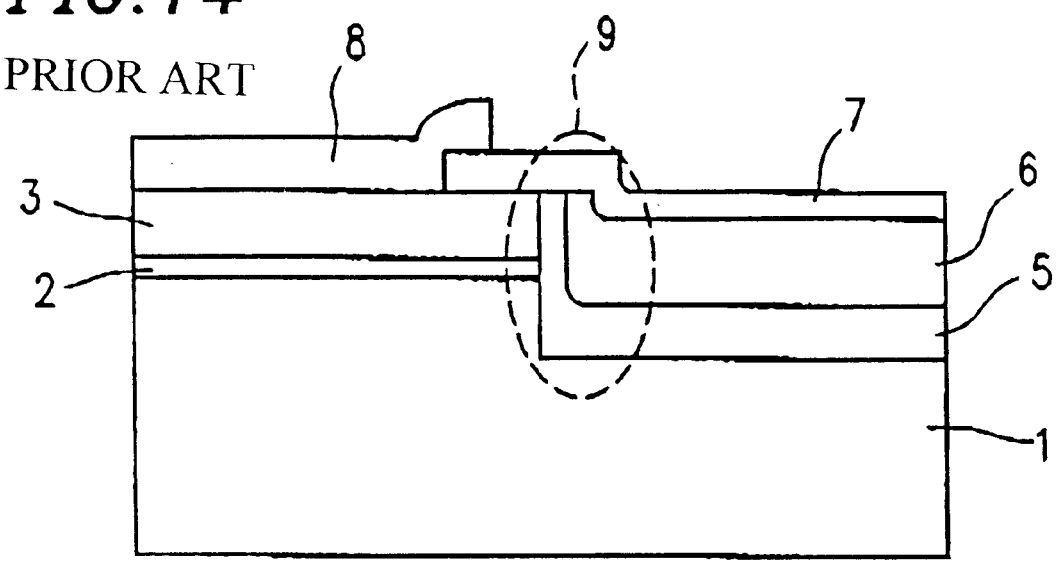
FIG. 14 is a schematic cross-sectional view showing a conventional integrated optical circuit device.
Figure 15:
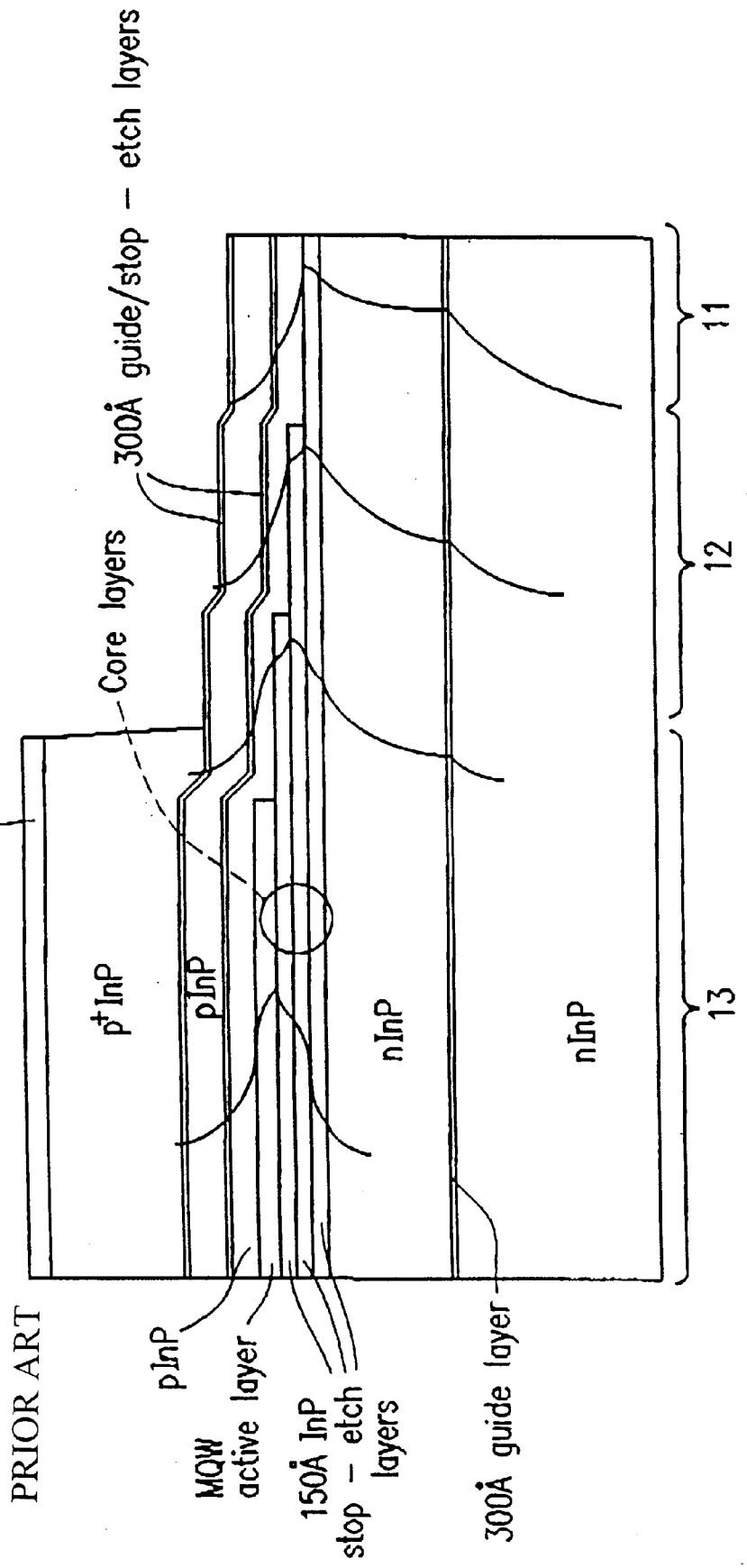
FIG. 15 is a schematic cross-sectional view showing another conventional integrated optical circuit device.

In the present example, the side regions of the buried portion 114 is buried with polyimide, but it may alternatively be buried with a semiconductor material. In that case, after the formation of the layered structure including the three AlGaAs layers 21 to 23, regions surrounding the buried portion 114 of the multimode interference region 20 are etched away using a mask 117 having an appropriate mask pattern, as shown in FIG. 13B, and an SiO$_2$ film 117a is formed by a bias sputtering method on the exposed lateral portion of the buried portion 114. Thereafter, the final structures of the semiconductor laser section 10 and the optical waveguide section 30 are formed as shown in FIG. 13C.

As a result, it becomes possible to perform the formation process of the semiconductor laser section 10 and the optical waveguide section 30 and the burying process of the side regions of the multimode interference region 20 through the same process.

According to the present invention, highly efficient optical coupling between a plurality of optical elements having different light distribution widths along the thickness direction is realized, so that an integrated optical circuit device suitable for integration can be provided.

By optimizing the length and the width of the multimode interference region, it becomes possible to reduce the radiation loss due to mismatching of the longitudinal modes associated with coupling of one optical element to another, achieve conversion of the transverse mode, and reduce the coupling loss due to imperfect burying (imperfect flatness) of the multimode interference region. By forming the buried portion of the multimode interference region with a material having an aluminum mole fraction of 0.3 or less, an excellent device can be provided with substantially no deposition of the burying material on the mask.

The integrated optical circuit device according to the present invention can be formed through a simpler process than those required for conventional devices. Specifically, the integrated optical circuit device can be produced through two MOCVD growth processes, where the second MOCVD growth process is merely performed to form the buried portion of the multimode interference region. This prevents degradation in crystallinity due to any regrowth which would otherwise affect the operational characteristics of the device.

In the case of employing a semiconductor laser element (semiconductor laser section) and an optical waveguide element (optical waveguide section) as the optical elements (optical element sections) to be integrated, an integrated optical circuit device which is susceptible to substantially no leakage current from the semiconductor laser section can be obtained by burying a thin interface layer of i-type material at an interface between a multimode interference region and the semiconductor laser section. Furthermore, according to the present invention, it is also possible to perform the formation of a ridge in the optical waveguide section concurrently with the formation of a lower electrode of the semiconductor laser section. It is also possible to perform the formation of a mesa structure of the optical waveguide concurrently with the etching of the multimode interference region, and/or perform the formation of the buried portion of the multimode interference region concurrently with the burying process of both sides of the optical waveguide section. This makes for simplicity and efficiency of the production process.

By forming a groove structure by etching during the formation of the multimode interference region, the burying of the groove structure can be accomplished so as to become substantially flat along the longitudinal direction of the groove structure, thereby improving the characteristics of the multimode interference region.

More preferably, the deposition of the multimode interference region may be performed prior to the deposition of the layers which function as a light emitting portion of the semiconductor laser element (semiconductor laser section) and the layers which function as an optical waveguide layer of the optical waveguide element (optical waveguide section), and then etching is performed so as to secure an area for forming the semiconductor laser element (semiconductor laser section) and the optical waveguide element (optical waveguide section), respectively. Then, the actual formation of the respective elements (sections) follows so that an integrated optical circuit device can be obtained. As a result, an even flatter multimode interference region is obtained, thereby improving the device characteristics.

By coupling multiple stages so as to incorporate a plurality of multimode interference regions and optical buffer layers, it becomes possible to further improve the coupling efficiency.

Various other modifications will be apparent to and can be readily made by those skilled in the art without departing from thy scope and spirit of this invention. Accordingly, it is not intended that the scope of the claims appended hereto be limited to the description as set forth herein, but rather that the claims be broadly construed.

What is claimed is:

1. An integrated optical circuit device comprising:
   a first optical element section including first and second element regions deposited along a thickness direction;
   a second optical element section formed away from the first optical element section; and
   a multimode interference region provided between the first and second optical element sections, the multimode interference region including a buried portion formed along a light propagation direction, wherein a width of the buried portion of the multimode interference region along a direction perpendicular to the light propagation direction changes in one of a gradual manner and a stepwise manner, and
   wherein the first and second optical element sections are optically coupled to each other via the multimode interference region.

2. An integrated optical circuit device comprising:
   a first optical element section including first and second element regions deposited along a thickness direction;
   a second optical element section formed away from the first optical element section; and
   a multimode interference region provided between the first and second optical element sections, the multimode interference region including a buried portion formed along a light propagation direction,
   wherein the first and second optical element sections are optically coupled to each other via the multimode interference region, and wherein a thin interface region is formed between the first optical element section and the multimode interference region.

3. An integrated optical circuit device comprising:
   a first optical element section including first and second element regions deposited along a thickness direction;
   a second optical element section formed away from the first optical element section; and
   a multimode interference region provided between the first and second optical element sections, the multimode interference region including a buried portion formed along a light propagation direction, wherein the buried portion of the multimode interference region comprises two or more layered subregions, and
   wherein the first and second optical element sections are optically coupled to each other via the multimode interference region.

4. An integrated optical circuit device, comprising:
   a first optical element section including first and second element regions deposited along a thickness direction and having mutually different light distribution widths;
   a multimode interference region formed in a position along a propagation direction of light outgoing from the first optical element section, the multimode interference region including a buried portion which has a multimode wave guide structure along each of the thickness direction and an in-plane direction which is perpendicular to the thickness direction, wherein the buried portion of the multimode interference region comprises two or more layered subregions; and
   a second optical element section formed away from the first optical element section with the multimode interference region interposed therebetween,
   wherein the first and second optical element sections are optically coupled to each other via propagation of the light outgoing form the first optical element section through the multimode interference region to the second optical element section.

* * * * *

UNITED STATES PATENT AND TRADEMARK OFFICE
CERTIFICATE OF CORRECTION

PATENT NO.    : 6,480,640 B1
DATED         : November 12, 2002
INVENTOR(S)   : Atsushi Shimonaka and Hidenori Kawanishi It is certified that error appears in the above-identified patent and that said Letters Patent is hereby corrected as shown below:

Title page,
Item [73], Assignee, please replace the word "Haisha" with -- Kaisha --;
Item [57], ABSTRACT,
Line 5, please replace the word "section," with -- section; --;

Column 1,
Line 35, please replace the word "Including" with -- including --;

Column 2,
Line 1, please replace the word "hereinafter ter referred" with -- hereinafter referred --;

Column 3,
Line 49, please replace the word "section," with -- section. --;

Column 4,
Line 38, please replace the words "v plurality" with -- a plurality --;

Column 5,
Line 58, please replace the words "illustrating A" with -- illustrating a --;

Column 6,
Line 1, please replace the words "FIG. 5 is graph" with -- FIG. 5 is a graph --;
Line 22, please replace the word "mods" with -- mode --;

Column 7,
Line 13, please replace the word "Gays" with -- GaAs --;

Column 8,
Line 8, please replace the word "etchent" with -- etchant --;
Line 25, please replace the words "the, ridges" with -- the ridges --;
Line 36, please replace the word "loser" with -- laser --;
Equations 1 and 2, please replace "$n^2_r - n^2_c$" with -- $n_r^2 - n_c^2$ --;

Column 9,
Line 39, please replace the word "lose" with -- loss --;
Line 65, please replace the word "mods" with -- mode --;

Column 10,
Line 52, please replace the word "loser" with -- laser --;

UNITED STATES PATENT AND TRADEMARK OFFICE
CERTIFICATE OF CORRECTION

PATENT NO. : 6,480,640 B1
DATED : November 12, 2002
INVENTOR(S) : Atsushi Shimonaka and Hidenori Kawanishi It is certified that error appears in the above-identified patent and that said Letters Patent is hereby corrected as shown below:

Column 12,
Line 15, please replace the words "an and" with -- an end --;
Line 38, please replace "30 is 2 m" with -- 30 is 2 $\mu$m --;

Column 13,
Line 8, please replace the words "formed 80" with -- formed so --;
Line 13, please replace "end face. of" with -- end face of --;
Line 29, please replace "profile," with -- profile. --;
Line 35, please replace the words "current 10 injection" with -- current injection --;

Column 14,
Line 2, please replace the words "incorporates an" with -- incorporates a --;
Line 13, please replace the words "section 10 is and" with -- section 10 and --;
Line 18, please replace "regions,31" with -- regions 31 --;

Column 15,
Line 26, please replace the word "Length" with -- length --;
Line 34, please replace the word "lose" with -- loss --;
Line 61, please replace "invention:" with -- invention; --;

Column 16,
Equation 5, please replace "$W_{1w3}$" with -- $W_1W_3$ --;

Column 17,
Line 7, please replace the words "formed 90 as" with -- formed so as --;
Line 62, please replace the word "RIDE" with -- RIBE --;

UNITED STATES PATENT AND TRADEMARK OFFICE
CERTIFICATE OF CORRECTION

PATENT NO. : 6,480,640 B1
DATED : November 12, 2002
INVENTOR(S) : Atsushi Shimonaka and Hidenori Kawanishi It is certified that error appears in the above-identified patent and that said Letters Patent is hereby corrected as shown below:

<u>Column 21,</u>
Line 35, please replace the word "thy" with -- the --;

<u>Column 22,</u>
Line 52, please replace the words "outgoing form" with -- outgoing from --;

Signed and Sealed this

Eighth Day of April, 2003

JAMES E. ROGAN
*Director of the United States Patent and Trademark Office*